(12) United States Patent
Maeda et al.

(10) Patent No.: US 6,465,292 B2
(45) Date of Patent: Oct. 15, 2002

(54) METHOD OF MANUFACTURING A SEMICONDUCTOR DEVICE HAVING REDUCED POWER CONSUMPTION WITHOUT A REDUCTION IN THE SOURCE/DRAIN BREAKDOWN VOLTAGE

(75) Inventors: Shigenobu Maeda, Hyogo (JP); Yasuo Yamaguchi, Hyogo (JP); Toshiaki Iwamatsu, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/061,211

(22) Filed: Feb. 4, 2002

(65) Prior Publication Data

US 2002/0094614 A1 Jul. 18, 2002

Related U.S. Application Data

(62) Division of application No. 09/169,903, filed on Oct. 9, 1998, which is a continuation of application No. PCT/JP96/03369, filed on Nov. 15, 1996.

(51) Int. Cl.⁷ .......................................... H01L 21/8234
(52) U.S. Cl. ..................... 438/197; 438/588; 438/163; 438/289; 438/290; 438/291; 438/311
(58) Field of Search ................. 438/585–592, 438/163, 197–200, 289–291, 311; 257/392–398

(56) References Cited

U.S. PATENT DOCUMENTS

| | | | |
|---|---|---|---|
| 4,267,632 A | * 5/1981 | Shappir ...................... | 257/316 |
| 5,012,312 A | 4/1991 | Kawamoto .................. | 257/398 |
| 5,144,394 A | 9/1992 | Hirao et al. ................ | 257/396 |
| 5,355,012 A | 10/1994 | Yamaguchi et al. ........ | 257/409 |
| 5,357,137 A | 10/1994 | Hayama ...................... | 257/396 |
| 5,396,096 A | 3/1995 | Akamatsu et al. .......... | 257/336 |
| 5,498,894 A | 3/1996 | Kokubun ..................... | 257/349 |
| 5,670,816 A | 9/1997 | Hatano et al. ............... | 257/394 |
| 5,831,323 A | 11/1998 | Motonami et al. .......... | 257/506 |
| 5,898,204 A | 4/1999 | Watanabe .................... | 257/349 |
| 6,017,783 A | * 1/2000 | Yamazaki et al. .......... | 438/154 |
| 6,064,090 A | 5/2000 | Miyamoto et al. .......... | 257/347 |
| 6,107,160 A | * 8/2000 | Hebert et al. ............... | 257/340 |
| 6,122,815 A | * 9/2000 | Kownacki et al. .......... | 174/255 |
| 6,144,081 A | 11/2000 | Hsu et al. .................... | 257/397 |

FOREIGN PATENT DOCUMENTS

| | | | |
|---|---|---|---|
| EP | 0 370 809 | 5/1990 | |
| JP | 3-55-166959 | 12/1980 | ................. 257/396 |
| JP | 4-199574 | 7/1992 | |
| JP | 8-125187 | 5/1996 | |

* cited by examiner

Primary Examiner—Richard Booth
Assistant Examiner—Jennifer M. Kennedy
(74) Attorney, Agent, or Firm—McDermott, Will & Emery

(57) ABSTRACT

An SOI layer is formed on a silicon substrate with a buried insulating layer therebetween. An SOI-MOSFET is formed including a drain region and a source region that are formed to define a channel formation region at the SOI layer and including a gate electrode layer opposite to the channel formation region with an insulating layer therebetween. An FS isolation structure is formed to have an FS plate opposite to a region of the SOI layer in the vicinity of the edge portion of the drain region and the source region, and to electrically isolate the SOI-MOSFET from other elements by applying a prescribed potential to the FS plate to fix the potential of the region of the SOI layer opposite to the FS plate. The channel formation region includes two edge portions on both sides and a central portion between the edge portions in a direction of a channel width, and a channel length at the edge of a prescribed region is smaller than a channel length at the central portion.

11 Claims, 25 Drawing Sheets

A—A CROSS SECTION

A—A CROSS SECTION

A—A CROSS SECTION

A—A CROSS SECTION

A—A CROSS SECTION

A—A CROSS SECTION

A — A CROSS SECTION

A — A CROSS SECTION

C — C CROSS SECTION

B — B CROSS SECTION

C—C CROSS SECTION

B—B CROSS SECTION

F—F CROSS SECTION ly to a semiconductor device
METHOD OF MANUFACTURING A SEMICONDUCTOR DEVICE HAVING REDUCED POWER CONSUMPTION WITHOUT A REDUCTION IN THE SOURCE/DRAIN BREAKDOWN VOLTAGE This application is a divisional of Application Ser. No. 09/169,903 filed Oct. 9, 1998 is still pending, which is a continuation of International Application No. PCT/JP96/03369, whose international filing date is Nov. 15, 1996.

TITLE OF THE INVENTION

Semiconductor Device and Method of Manufacturing Thereof

This is a Continuation of International Application PCT/JP96/03369 with an international filing date of Nov. 15, 1996, now abandoned.

BACKGROUND OF THE INVENTION

1. Field of the Invention

The present invention relates to a semiconductor device and a method of manufacturing thereof, and specifically to a semiconductor device having a semiconductor layer disposed on a substrate with an insulating layer therebetween, and a method of manufacturing the same.

2. Background Art

A so called SOI (Semiconductor on Insulator) structure is known as the one having a semiconductor layer placed on a substrate with an insulating layer therebetween in an attempt to reduce the junction capacitance, to improve the breakdown voltage for isolating elements from each other, or to prevent the turn on or latch up of a parasitic thyristor. An MOSFET (Metal Oxide Semiconductor Field Effect Transistor) formed at the semiconductor layer of the structure is generally referred to as SOI-MOSFET.

As shown in FIG. 32, the SOI-MOSFET is built at a semiconductor layer (hereinafter referred to as SOI layer) 105 deposited on a substrate 1 with an insulating layers 3 therebetween. Specifically, the SOI-MOSFET is constituted of a drain region 105a and a source region 105b formed at SOI layer 105, and a gate electrode layer 109 placed on a region 105c (hereinafter referred to as channel formation region) between drain region 105a and source region 105b and opposite to channel formation region 105c with a gate insulating layer 7 therebetween.

Drain region 105a and source region 105b of the SOI-MOSFET conventionally have a low breakdown voltage since the potential of SOI layer 105 (hereinafter conveniently referred to as body potential) is floating.

More specifically, in the case of n channel, when voltage is applied to gate electrode layer 109 to form a channel at the surface of channel formation region 105c, electrons move from source region 105b toward drain region 105a. Impact ionization caused by the electrons generates a number of electron-hole pairs in the vicinity of the edge of drain region 105a. Although the electrons are removed from drain region 105a to the outside of SOI layer 105, the holes accumulate in SOI layer 105 because of the floating state of SOI layer 105.

Consequently, when a positive voltage is applied to SOI layer 105, source/drain regions 105a and 105b and channel formation region 105c are forward biased. Accordingly, current easily flows between drain region 105a and source region 105b and source drain breakdown voltage decreases.

A proposed element isolation method for improving the source-drain breakdown voltage is field shield isolation (hereinafter referred to as FS isolation).

FIG. 33 is a bird's eye view illustrating a structure of an SOI-MOSFET to which the FS isolation structure is applied. FIG. 34A is a schematic plan view of the MOSFET portion viewed in the direction of the arrow H of FIG. 33, and FIG. 34B is a schematic plan view along the F—F line of FIG. 34A.

Referring chiefly to FIG. 33, an SOI layer 105 is formed on a silicon substrate 1 with a buried insulating layer 3 interposed. As described in relation to FIG. 32, an MOSFET constituted of source/drain regions 105a, 105b and a gate electrode layer 109 is formed at SOI layer 105.

Gate electrode layer 109 extends in a region opposite to SOI layer 105 with a gate insulating layer 7 therebetween while keeping a prescribed gate length (FIG. 34A).

The FS isolation structure is formed to have an FS plate 11 opposite to SOI layer 105 at an edge of the region where the MOSFET is formed with an intervening insulating layer. According to the method of isolating transistors by the FS isolation method, the potential of SOI layer 105 under FS plate 11 is fixed by applying a prescribed voltage to FS plate 11 for electrically isolating devices such as transistors that are adjacent to each other.

The voltage applied to FS plate 11 is, for example, 0V for an nMOSFET, and Vcc (Power supply voltage) for a pMOSFET.

A body contact 23 for drawing out potential from SOI layer 105 is provided opposite to the MOSFET formation region with SOI layer 105 under FS plate therebetween.

By providing body contact 23 on the opposite side of the MOSFET formation region with the FS isolation therebetween, holes generated by the impact ionization can be drawn out from the body contact while electrical isolation between edges of the source and the drain of adjacent transistors is maintained. The source-drain breakdown voltage can be improved since holes in SOI layer 105 can be drawn out.

However, if the body potential is fixed by providing body contact 23 (body fix), an advantage specific to the SOI-MOSFET of a small substrate bias effect is lost. Further, a problem arises that an advantage of the SOI structure of high speed and low power consumption is decreased. The problem is hereinafter described in detail.

FIG. 35 is a cross sectional view schematically showing a structure of a transistor formed at a normal semiconductor substrate (hereinafter referred to as bulk-transistor). Referring to FIG. 35, the bulk-transistor includes a drain region 205a and a source region 205b formed to define a channel region 205e at a semiconductor substrate 201, and a gate electrode layer 209 formed on the region therebetween with an intervening gate insulating layer 207.

The substrate bias effect described above refers to increase in threshold voltage Vth caused by a depletion layer 205d extending toward substrate 201 when a junction of source/drain regions 205a and 205b and substrate 201 is reverse biased. If the channel length of the bulk transistor is long, threshold voltage Vth increases according to the equation below.

$$Vth = V_{FB} + 2\phi_F + \frac{\sqrt{2\varepsilon_S\varepsilon_O qN_A(2\phi_F + V_B)}}{C_{ox}}$$

$V_{FB}$: flat band voltage
$\phi_F$: built-in potential of channel 205e
$\varepsilon_O$: dielectric constant in vacuum $\epsilon_S$: relative dielectric of silicon q: a charge amount $N_A$: concentration of impurities in channel 205e $C_{OX}$: gate capacitance Variation of threshold voltage Vth of the bulk-transistor according to substrate bias $V_B$ is shown in FIG. 36.

If the MOSFET is formed at a floating SOI layer 105 shown in FIG. 37, substrate bias $V_B$ is applied to SOI layer 105 via a buried oxide film 3. Therefore, substrate bias $V_B$ has little effect on threshold voltage Vth. As shown in FIG. 38, threshold voltage Vth scarcely changes with substrate bias $V_B$.

However, if substrate bias $V_B$ is directly applied to SOI layer 105 as shown in FIG. 39 to fix the body, the junction is reverse biased when substrate bias $V_B$ is applied as in the bulk-transistor, resulting in increase in threshold voltage Vth due to a depletion layer 105d extending into a channel formation region 105c even in the SOI-MOSFET.

If threshold voltage Vth increases as described above, drain current Id decreases to make it difficult to operate an LSI (Large Scale Integrated Circuit) at a high speed.

In addition, the high threshold voltage Vth prevents reduction of supply voltage, and power consumption increases.

SUMMARY OF THE INVENTION

One object of the present invention is to provide a semiconductor device having an excellent source-drain breakdown voltage as well as a small substrate bias effect operating at high speed and with low power consumption, and a method of manufacturing such a semiconductor device.

A semiconductor device according to the present invention includes a semiconductor layer, a gate insulation type field effect transistor, and a conductive layer for isolation. The semiconductor layer is disposed on a substrate with an insulating layer therebetween. The gate insulation type field effect transistor includes a pair of source/drain regions arranged at the semiconductor layer spaced from each other, and a gate electrode layer opposite to a channel formation region between the paired source/drain regions with a gate insulating layer therebetween. A channel is formed in the channel formation region by controlling the potential of the gate electrode layer. The conductive layer for isolation is electrically insulated from the semiconductor layer. The gate insulation type field effect transistor is electrically isolated from other elements by controlling the potential of the isolation conductive layer to fix the potential of a region of the semiconductor layer opposite to the insulation conductive layer. Potential can be applied to the channel formation region from a prescribed region via the region of the semiconductor layer opposite to the isolation conductive layer. In the channel formation region, edge portions on both sides of the channel formation region and a central portion sandwiched between the edge portions are placed in the direction of the channel width. A region of the semiconductor layer, located between the central portion and the prescribed region and opposite to the gate electrode layer (opposite region), has a structure which is completely depleted prior to the central portion when voltage is applied to the prescribed region.

The semiconductor device of the present invention is structured such that a region at the edge of the channel formation region is completely depleted before the central portion thereof is depleted when voltage is applied to the gate. If the region at the edge is completely depleted prior to depletion of the central portion, subsequent application of the body potential to the central portion is blocked. Accordingly, extension of a depletion layer at the junction of the source/drain regions and the semiconductor layer in the central portion is prevented, so that threshold voltage Vth can be reduced. Since threshold voltage Vth decreases, drain current Id increases to easily implement high speed operation of the LSI. Further, reduction of threshold voltage Vth provides a reduced supply voltage and thus a reduced power consumption.

Before the edge portion is completely depleted, carriers (hole or electron) generated by impact ionization are drawn out from the semiconductor layer through a body contact. As a result, the number of carriers accumulating in the central portion after the edge portion is completely depleted can be reduced compared with a semiconductor layer which is completely floating. Therefore, reduction of source-drain breakdown voltage due to accumulation of carriers in the semiconductor layer can be prevented. After the edge portion is completely depleted, carriers are drawn out from the central portion to some extent by diffusion or recombination. As such, reduction of source-drain breakdown voltage can be prevented compared with the completely floating semiconductor layer.

In the aspect described above, the opposite region is preferably located at the edge portion of the channel formation region.

Further, in the above described aspect, an area of a cross section of the channel formation region in the direction of the channel length defined by (sandwiched between) the front and back surfaces of the semiconductor layer is preferably smaller at the edge portion than at the central portion.

By making the cross sectional area of the edge portion different from that of the central portion, the edge portion can be completely depleted prior to depletion of the central portion. As a result, a gate insulation type field effect transistor which is superior in the source-drain breakdown voltage, has a small substrate bias effect, and operates at high speed with low power consumption can be obtained.

In the aspect described above, a channel length at the edge portion of the channel formation region is preferably smaller than a channel length at the central portion of the channel formation region.

Since widths of the edge portion and the central portion in the direction of the channel length are different from each other, the edge portion can be completely depleted prior to depletion of the central portion. Consequently, a gate insulation type field effect transistor which is superior in the source-drain breakdown voltage, has a small substrate bias effect, and operates at high speed with low power consumption can be obtained.

In the aspect described above, a gate length of the gate electrode layer is preferably smaller at a location opposite to the edge portion than at a location opposite to the central portion.

The edge portion and the central portion different from each other in the width in the direction of the channel length can be easily formed by injecting impurities into the semiconductor layer with the gate electrode as a mask.

In the above described aspect, preferably, the edge portion has a region where a thickness of the semiconductor layer is smaller than that at the central portion.

By providing different thicknesses of the semiconductor layer to the edge portion and the central portion, the edge portion can be completely depleted prior to depletion of the central portion. As a result, a gate insulation type field effect transistor having a superior source-drain breakdown voltage and a small substrate bias effect, and operating at high speed with low power consumption can be obtained.

In the aspect described above, at the edge portion, a trench having a depth of at least 100 Å is formed at the front or back surface of the semiconductor layer.

If the depth of the trench is less than 100 Å, the effect of the complete depletion of the edge portion preceding the central portion cannot be sufficiently achieved.

In the above described aspect, the source/drain region has a first impurity region of a relatively high concentration and a second impurity region of a relatively low concentration adjacent to the first impurity region on the channel formation region side. Preferably, the width in the channel length direction of the second impurity region adjacent to the edge portion is larger than that of the second impurity region adjacent to the central portion.

The second impurity region has a width larger at the edge portion than at the central portion. The second impurity region has a high parasitic resistance since the concentration of the impurities therein is relatively small. Therefore, when the transistor is turned on, current chiefly flows in the central portion having a narrow width of the second impurity region and a low parasitic resistance. In other words, the current hardly flows in the edge portion having a narrow width in the channel length direction, and an insulation gate type field effect transistor which is immuned to the short channel effect can be obtained.

In the aspect described above, a reflection film having a shape which is matched to that of the gate electrode layer is preferably formed on the gate electrode layer.

Since the reflection film is provided on the gate electrode layer, a resist region corresponding to the top of the edge portion can be exposed excessively by irregular reflection of exposure light from the reflection film when the gate electrode layer is exposed for patterning thereof Accordingly, the gate electrode layer having its length smaller at the edge portion than at the central portion can be formed without changing a gate electrode pattern of a photomask, and the manufacturing process can be simplified.

In the aspect described above, the semiconductor layer has an extended region which is electrically connected to the channel formation region and extends to the prescribed region with its circumference insulated. Potential is applicable to the extended region from the prescribed region, and the conductive layer for isolation is opposite to the extended region. The opposite region is located in the extension region between the prescribed region and a region opposite to the isolation conductive layer.

As a result, a region which is completely depleted prior to depletion of the central portion can be placed outside the region where the gate insulation type field effect transistor is formed.

In the above described aspect, preferably the concentration of the impurities in the opposite region is lower than that in the channel formation region.

Since the concentration of impurities in the opposite region and that in a region sandwiched between the paired source/drain regions are different from each other, the opposite region can be completely depleted prior to the region sandwiched between the paired source/drain regions. Consequently, an insulation gate type field effect transistor having a superior source-drain breakdown voltage and a small substrate bias effect, and operating at high speed and with low power consumption can be obtained.

In the aspect described above, the gate electrode layer preferably covers the surface of the top of the opposite region and both sides of the region.

Since the depletion layer can extend from the surface of the opposite region and both sides thereof, the opposite region can be completely depleted speedily. As a result, the effect of the substrate bias can be reduced.

A method of manufacturing a semiconductor device having a structure with a semiconductor layer formed on a substrate with an insulating layer interposed therebetween according to the present invention including the following steps.

A conductive layer for isolation electrically insulated from the semiconductor layer is next formed. A gate electrode layer opposite to the semiconductor layer with a gate insulating layer therebetween is formed. Paired source/drain regions are formed spaced from each other by introducing impurities into the semiconductor layer using the gate electrode layer as a mask. A gate insulation type field effect transistor formed of the paired source/drain regions and the gate electrode layer is fabricated, where a channel is formed in a channel formation region sandwiched between the paired source/drain regions by controlling the potential of the gate electrode layer. The gate insulation type field effect transistor can be electrically isolated from other elements by controlling the potential of the conductive layer for isolation to fix the potential of a region of the semiconductor layer opposite to the conductive layer for insulation. The channel formation region is provided such that potential can be applied from a prescribed region thereto via the region of the semiconductor layer opposite to the isolation conductive layer. In the channel formation region, two edge portions located on both sides and a central portion sandwiched between the edge portions are arranged in the direction of the channel width. The gate electrode layer is formed to have a region of a gate length smaller on the edge portions than on the central portion.

The edge portions and the central portion having different widths in the channel length direction can be easily formed by injecting impurities into the semiconductor layer using the gate electrode as a mask.

In the aspect described above, the step of forming the gate electrode layer includes a step of exposing a photoresist applied to a conductive layer with exposure light transmitted through a photomask having a gate electrode pattern, followed by developing to form a resist pattern and etching of the conductive layer using the resist pattern as a mask. At a location corresponding to an edge portion of the gate electrode pattern, there is a gap having a width smaller than the limit of resolution of a conventional stepper and isolating the gate electrode pattern.

As a result, there is a wider selection of shapes of the gate electrode pattern of the photomask.

In the above described aspect, in the step of forming the gate electrode layer, the conductive layer is patterned by the photolithography with a reflection film formed on the conductive layer corresponding to the gate electrode layer.

Since the reflection film is formed on the gate electrode layer, a resist region corresponding to the top of the edge portion can be exposed excessively by irregular reflection of exposure light from the reflection film when the gate electrode layer is exposed for patterning. Therefore, the gate electrode layer having its length smaller at the edge portions than at the central portion can be obtained without changing the shape of the gate electrode pattern of the photomask, and the manufacturing process can be simplified.

In the aspect described above, a step is further provided by which an insulating layer is formed to cover the gate electrode layer, and the insulating layer is left at a sidewall of the gate electrode layer by anisotropically etching the insulating layer. The region of the gate electrode layer having a small gate length located on the edge portion is provided to have a prescribed width in the direction of the gate width. The thickness of the insulating layer when it is formed is at least two times larger than the prescribed width.

Accordingly, an insulation gate type field effect transistor having its edge portion which is immuned to the short channel effect can be obtained.

In the aspect described above, the step of forming the gate electrode layer includes a step of exposing a photoresist applied onto the conductive layer with exposure light transmitted through a photomask having a gate electrode pattern, forming a resist pattern through development, and etching the conductive layer using the resist pattern as a mask. A first line width located correspondingly to the edge portion of the gate electrode pattern is smaller than a second line width located correspondingly to the central portion of the gate electrode pattern. A line width located correspondingly to a region sandwiched between the edge portion and the central portion of the gate electrode pattern is larger than the second line width.

Accordingly, a gate insulation type field effect transistor having its edge portion immune to the short channel effect can be obtained.

The foregoing and other objects, features, aspects and advantages of the present invention will become more apparent from the following detailed description of the present invention when taken in conjunction with the accompanying drawings.

Best Mode For Csrrying Out The Invention

DESCRIPTION OF THE PREFERRED EMBODIMENTS

First Embodiment

Figure 1A:
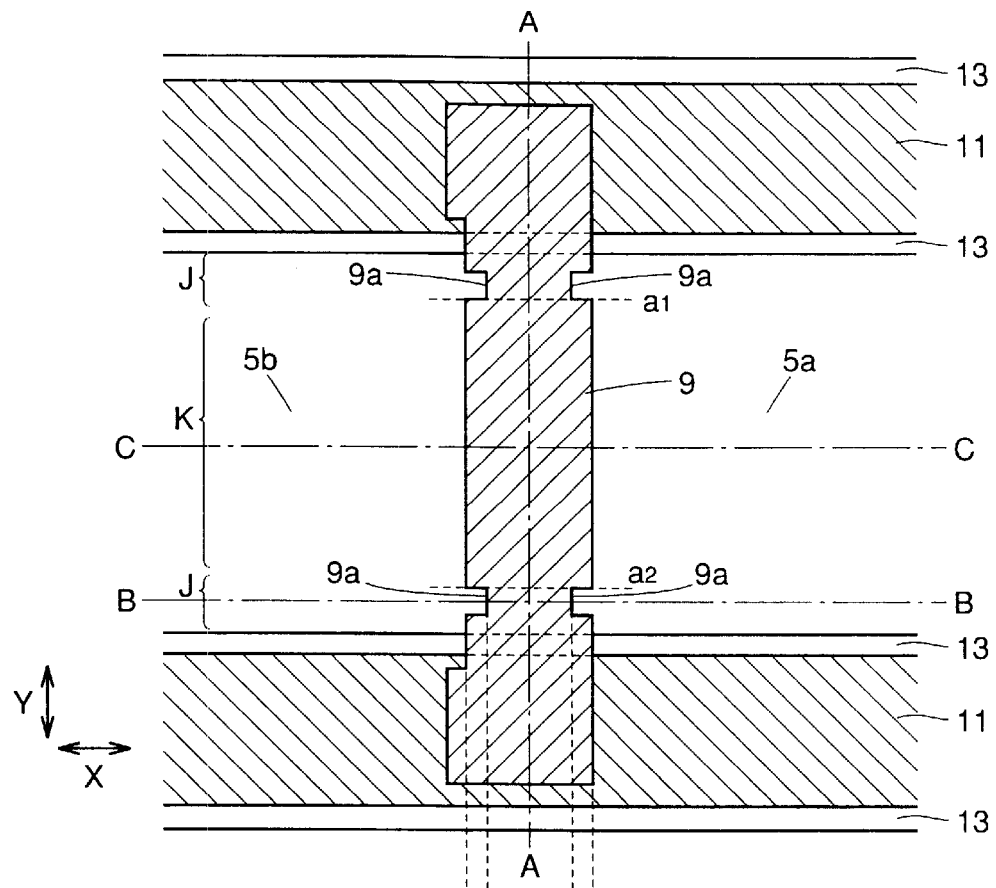
FIG. 1A is a plan view schematically showing a structure of a semiconductor device according to the first embodiment of the invention.
Figure 1B:
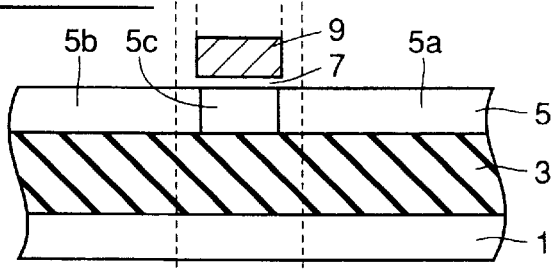
FIG. 1B is a schematic cross sectional view along the B—B line of FIG. 1A.
Figure 1C:
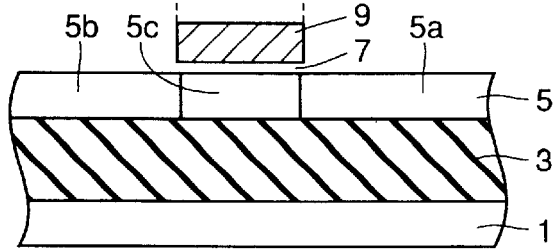
FIG. 1C is a schematic cross sectional view along the C—C line of FIG. 1A.

FIG. 1A is a plan view schematically showing a structure of a semiconductor device according to the first embodiment of the present invention. FIGS. 1B and 1C are schematic cross sections along the B—B line and C—C line of FIG. 1A.

Referring to FIGS. 1A, 1B and 1C, a semiconductor device of this embodiment has what is called SOI structure where an SOI layer 5 is formed on a silicon substrate 1 with a buried oxide film 3 therebetween. An SOI-MOSFET is formed at SOI layer 5.

The SOI-MOSFET includes a drain region 5a and a source region 5b arranged to sandwich a channel formation region 5c at SOI layer 5, and a gate electrode layer 9 opposite to channel formation region 5c with a gate oxide film 7 therebetween.

Referring chiefly to FIG. 1A, on SOI layer 5 at the edge of drain region 5a and source region 5b, an FS plate 11 is formed opposite to SOI layer 5 with an insulating layer (not shown) therebetween. FS isolation having FS plate 11 electrically isolates the SOI-MOSFET from other elements such as an adjacent transistor.

According to a method of isolating transistors by the FS isolation method, isolation is achieved by applying a prescribed potential to FS plate 11 to fix the potential of SOI layer 5 under FS plate 11 as described above.

This embodiment is characterized by shapes of channel formation region 5c and gate electrode layer 9. Channel formation region 5c includes two edge portions J on both sides in the direction of the channel width (direction of arrow Y) of the SOI-MOSFET, and a central portion K sandwiched between edge portions J and extending with a prescribed width (channel length) maintained. At the edge portions J, channel formation region 5c has a region of a width (channel length) in a direction of the channel length (direction of arrow X) smaller than that of the central portion K (see FIG. 1B: hereinafter referred to as narrowed portion).

Gate electrode layer 9 also extends with a prescribed width (gate length) maintained on central portion K, and has a narrowed portion 9a having a width (gate length) in a direction of the gate length (direction of arrow X) smaller on the narrowed portion of channel formation region 5c than on the central portion K.

The positions of the narrowed portion of channel formation region 5c and narrowed portion 9a of gate electrode layer 9 are approximately matched viewed in the direction of the plane shown in FIG. 1A.

Figure 33:
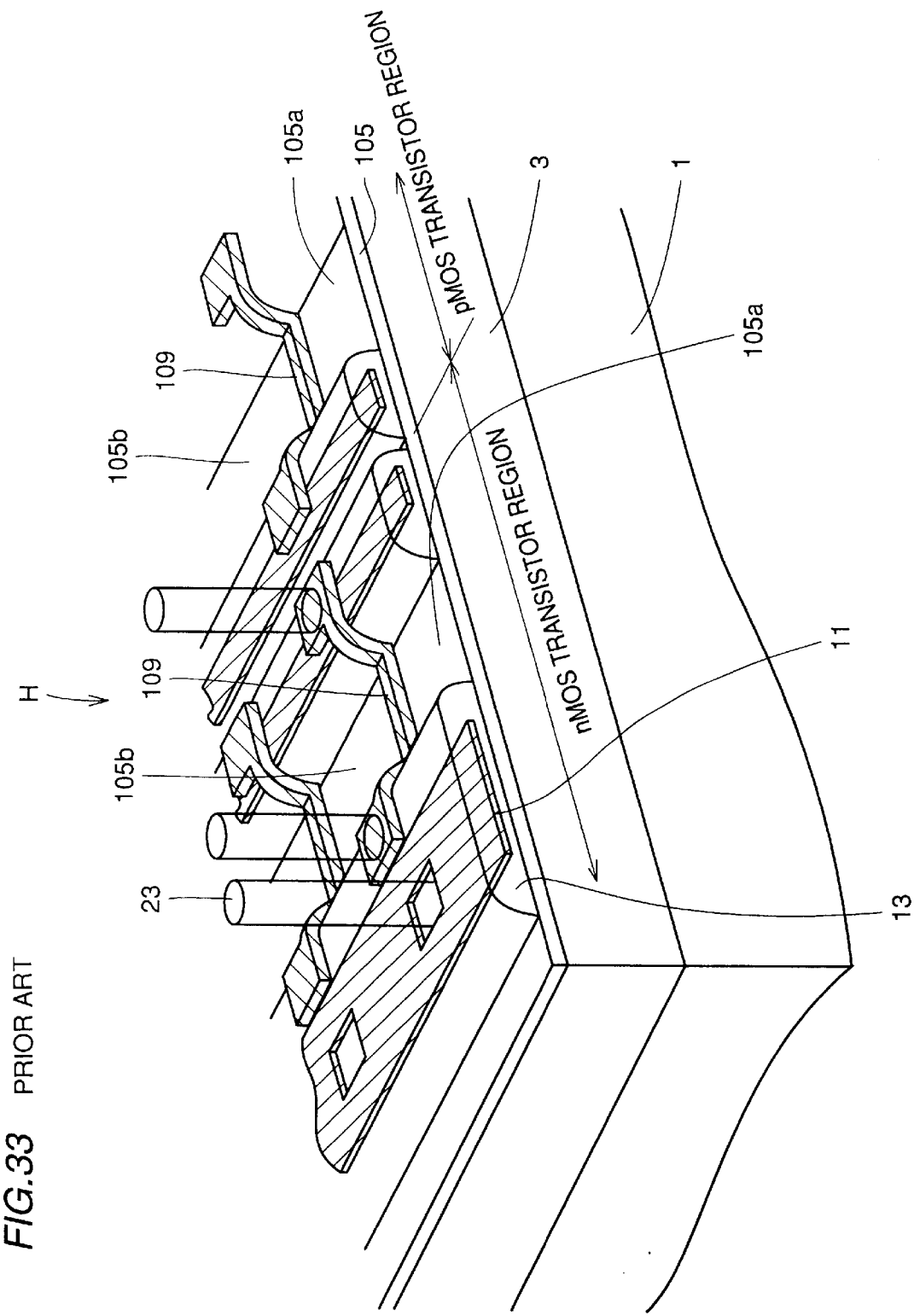
FIG. 33 is a bird's eye view schematically showing a structure of a conventional SOI-MOSFET to which FS separation is applied.
Figure 34A:
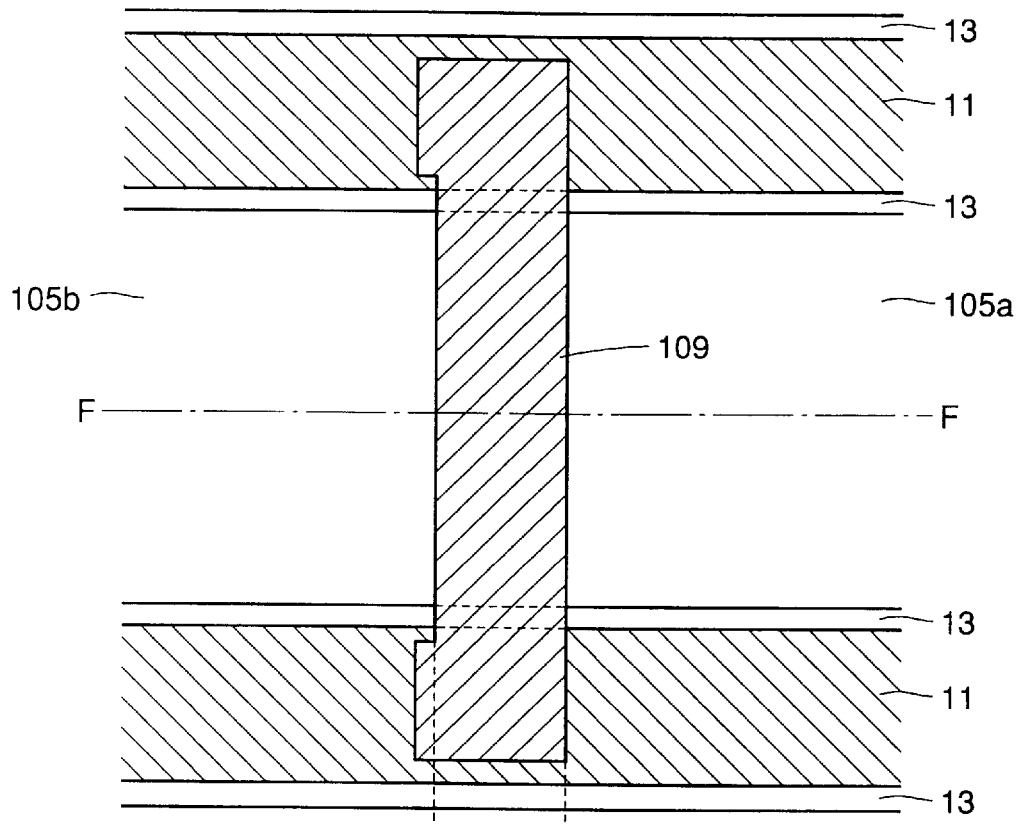
FIG. 34A is a schematic plan view viewed in the direction of the arrow E of FIG. 33.
Figure 34B:
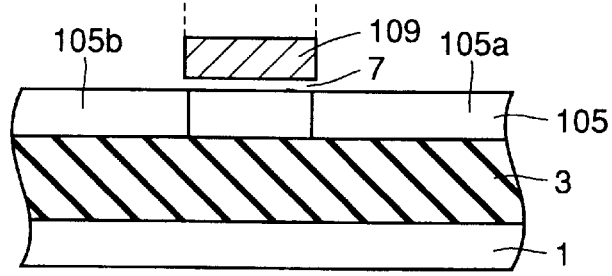
FIG. 34B is a schematic cross section along the F—F line of FIG. 34A.

Although not shown in the figure, in channel formation region 5c, a prescribed potential is applied via a region under FS plate 11 from a prescribed region (body contact 23) outside the region where MOSFET is formed as shown in FIG. 33.

Next a method of manufacturing a semiconductor device of this embodiment is described.

FIGS. 2–7 are schematic cross sections along the A—A line of FIG. 1A showing the method of manufacturing the semiconductor device of the first embodiment of the invention in order of steps.

Figure 2:
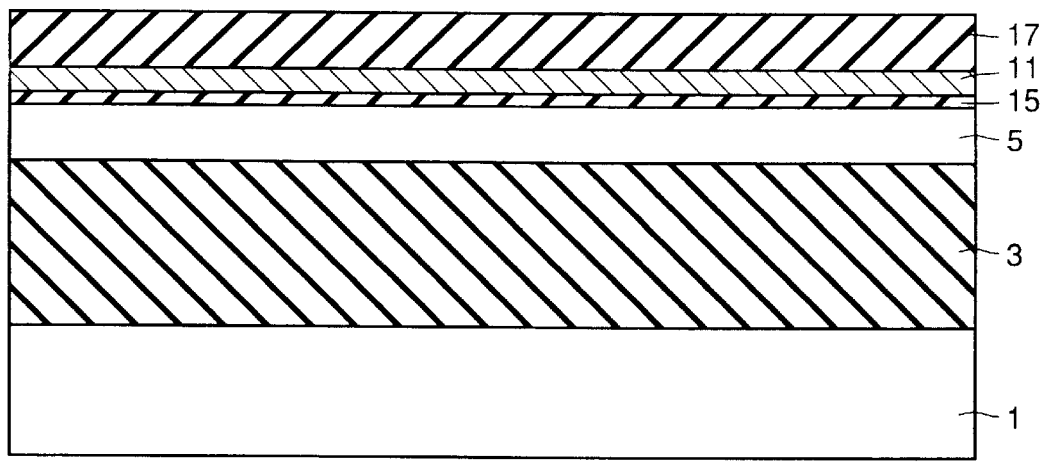
FIGS. 2–7 are schematic cross sections corresponding to the A—A line of FIG. 1A showing a method of manufacturing the semiconductor device according to the first embodiment of the invention in the order of steps.

Referring to FIG. 2, a wafer of the SOI structure having SOI layer 5 on silicon substrate 1 with buried oxide film 3 therebetween is prepared. On SOI layer 5 of the wafer, an insulating film 15 under the FS plate, a conductive layer 11 to be the FS plate, and insulating film 17 on the FS plate are successively formed with respective thicknesses of 20 nm, 50 nm and 100 nm. As conductive layer 11 to be the FS plate, for example, a polycrystal silicon film which has already doped with impurities when deposited (doped polysilicon) may be used, or a polycrystal silicon film which is not doped with impurities (non-doped polysilicon) and to which impurities are injected after deposited may be used. As insulating films 15 and 17 on and under the FS plate, for example, a silicon oxide film ($SiO_2$), a silicon nitride film (SiN) or a composite film of them is used.

Figure 3:
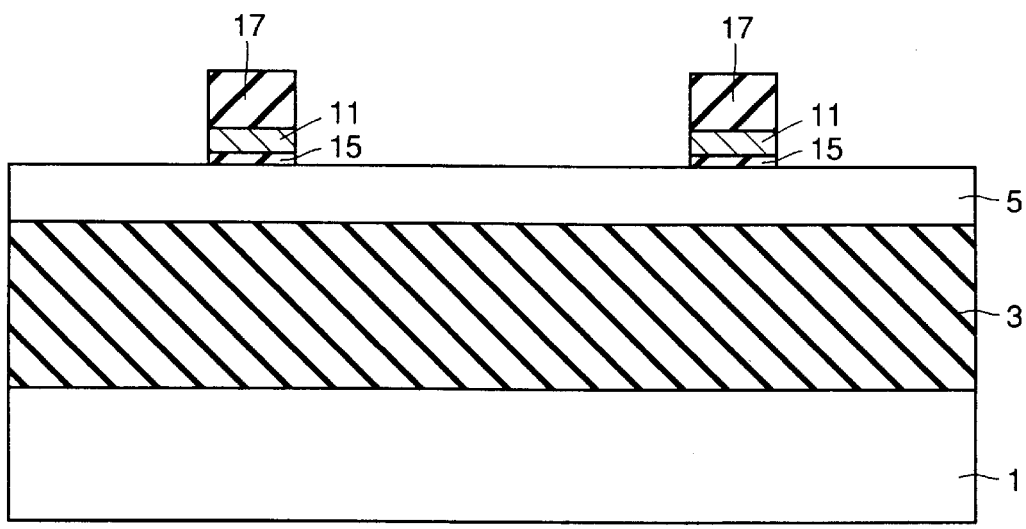

Referring to FIG. 3, by normally used photolithography and etching, FS plate 11, and insulating films 15 and 17 on and under the FS plate are left by patterning at a location where the FS isolation is provided.

Figure 4:
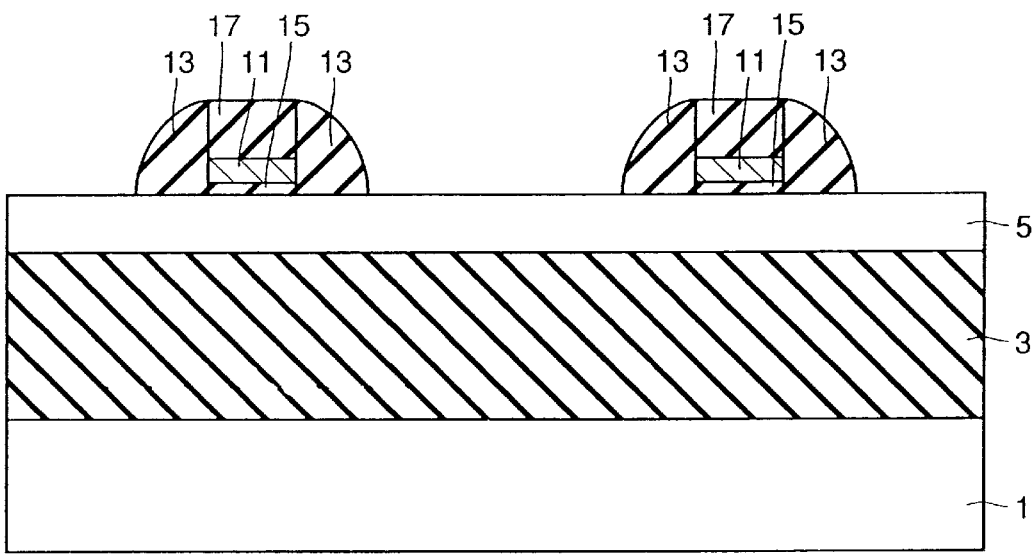

Referring to FIG. 4, a sidewall insulating layer 13 is formed at a sidewall of an FS isolation structure (including FS plate 11 and insulating films 15 and 17 on and under FS plate 11). Sidewall insulating layer 13 is formed to remain at the sidewall of the FS isolation structure by an anisotropic dry etching of a silicon oxide film deposited with a thickness of approximately 200 nm, for example.

Figure 5:
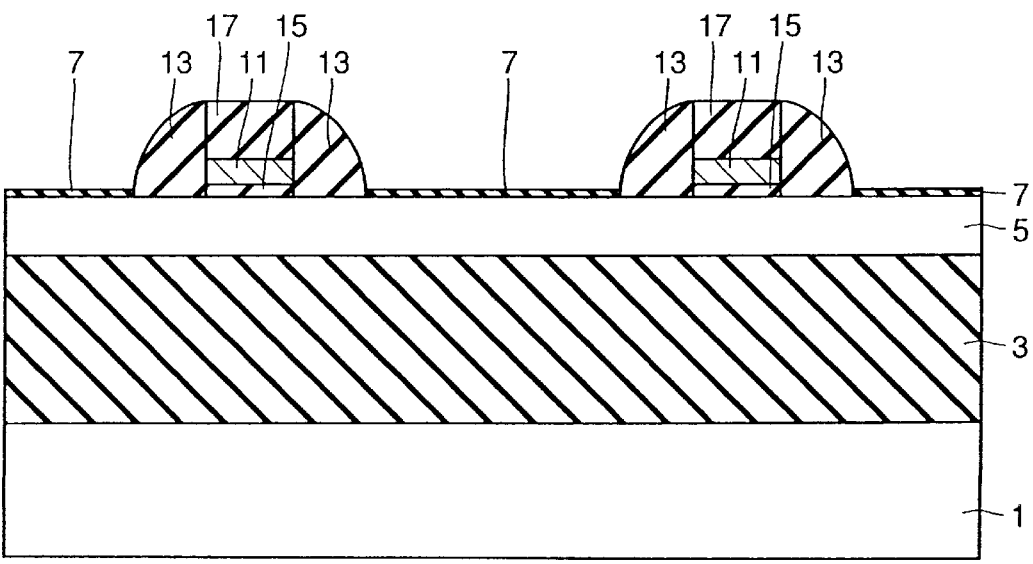

Referring to FIG. 5, a gate oxide film 7 is formed at the surface of semiconductor layer 5 with a thickness of approximately 7 nm by thermal oxidation, for example.

Figure 6:
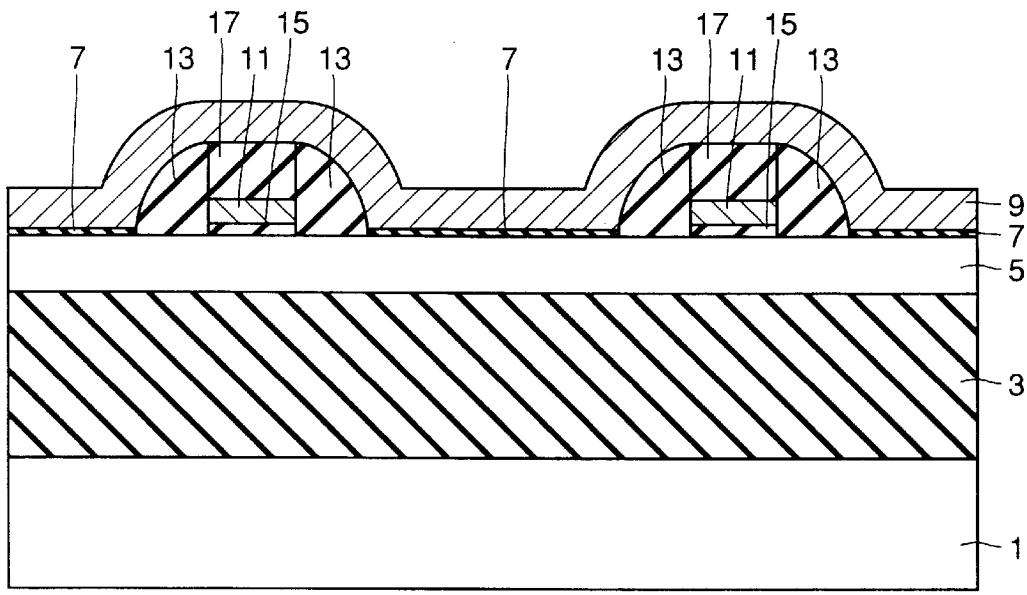

Referring to FIG. 6, a polysilicon layer 9 to be a gate electrode layer is deposited on the entire surface with a thickness of 250 nm, for example. As polysilicon layer 9, a doped polysilicon to which impurities have been injected already when deposited may be used, or a non-doped polysilicon doped with impurities after deposited may be used.

Figure 7:
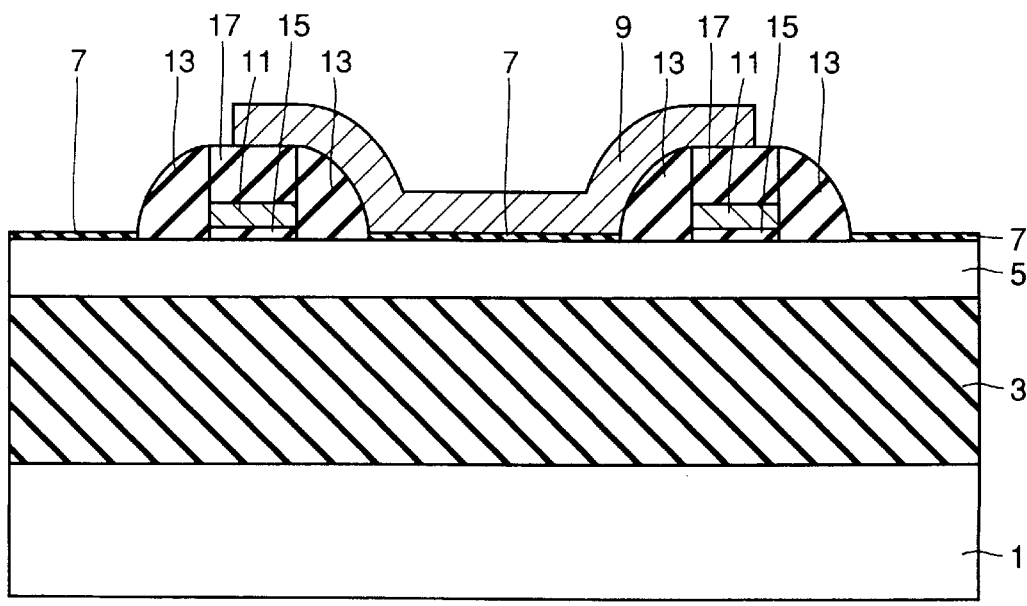

Referring to FIG. 7, gate electrode layer 9 is formed by patterning according to normal photolithography and etching of polysilicon layer 9. At this time, gate electrode layer 9 is patterned to have a narrowed portion in the vicinity of the FS isolation structure as shown in FIG. 1A. A pair of source/drain regions is formed by ion injection of impurities into SOI layer 5 using gate electrode layer 9 and the FS isolation structure as a mask. Accordingly, a narrowed portion at the edge of the channel formation region sandwiched between the source and drain regions is formed to match the narrowed portion of gate electrode layer 9.

A photoresist on gate electrode layer 9 may be patterned using a photomask (reticle) having a gate electrode pattern with a narrowed portion at a corresponding location, and the conductive layer to be gate electrode layer 9 may be patterned using the resist pattern as a mask in order to form gate electrode layer 9 having the narrowed portion.

The semiconductor device of this embodiment has a narrowed portion at the edge portion J of channel formation region 5c as described above. Therefore, the semiconductor device has a superior source-drain breakdown voltage and a small substrate bias effect, and operates at high speed and with low power consumption. This is described in detail below.

Figure 8:
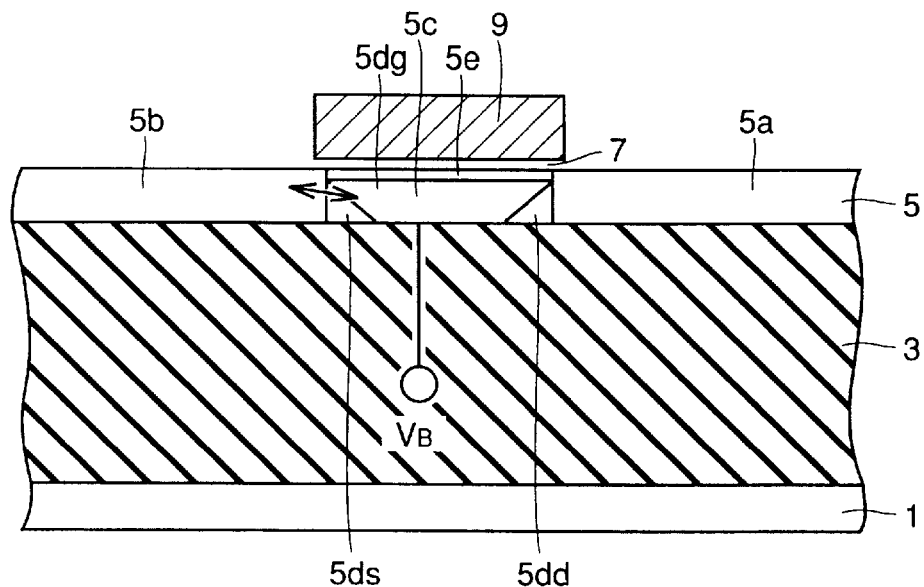
FIG. 8 is a schematic cross sectional view provided for describing depletion of a region sandwiched between source/drain regions of an SOI-MOSFET.
Figure 9:
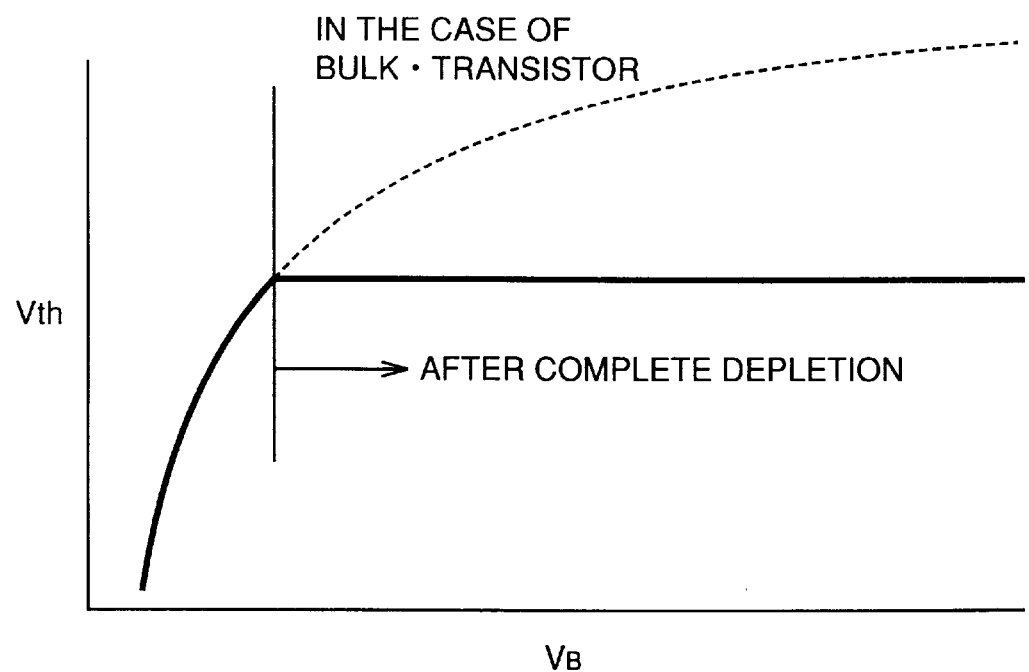
FIG. 9 is a graph showing a relation between substrate bias $V_B$ and threshold value Vth when a region sandwiched between source/drain regions of an SOI-MOSFET is completely depleted.

For the SOI-MOSFET in which substrate bias $V_B$ is directly applied to SOI layer 5 as shown in FIG. 8, or what is called body fixed SOI-MOSFET, a relation between substrate bias $V_B$ and threshold voltage Vth is shown in FIG. 9.

Figure 35:
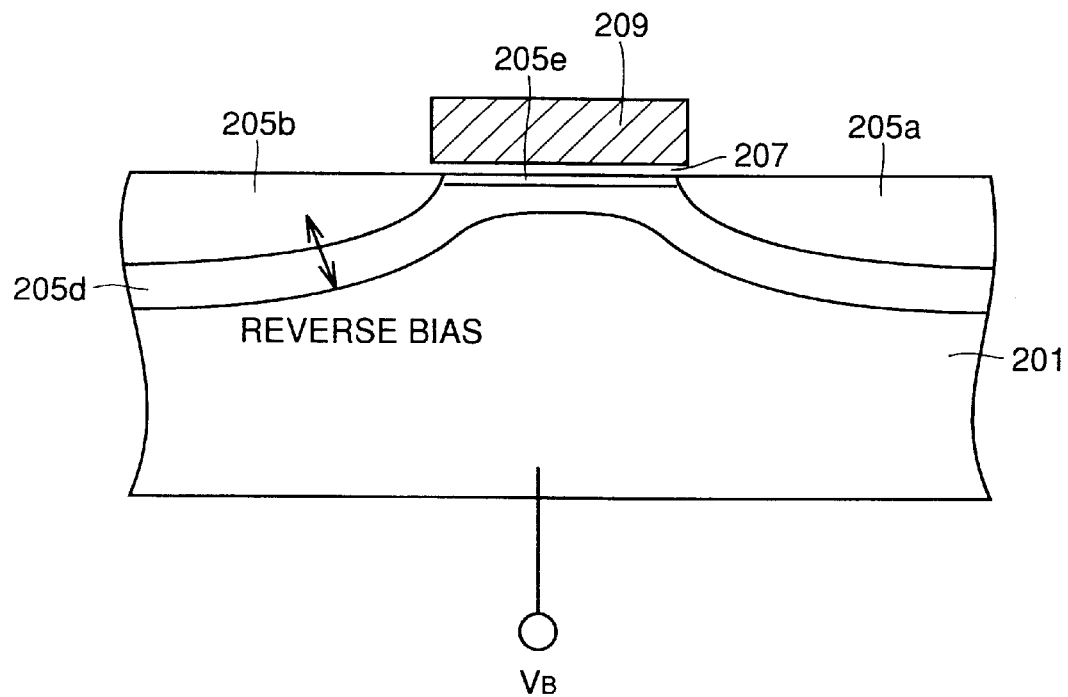
FIG. 35 is a schematic cross section provided for describing a substrate bias effect of a bulk-transistor.
Figure 36:
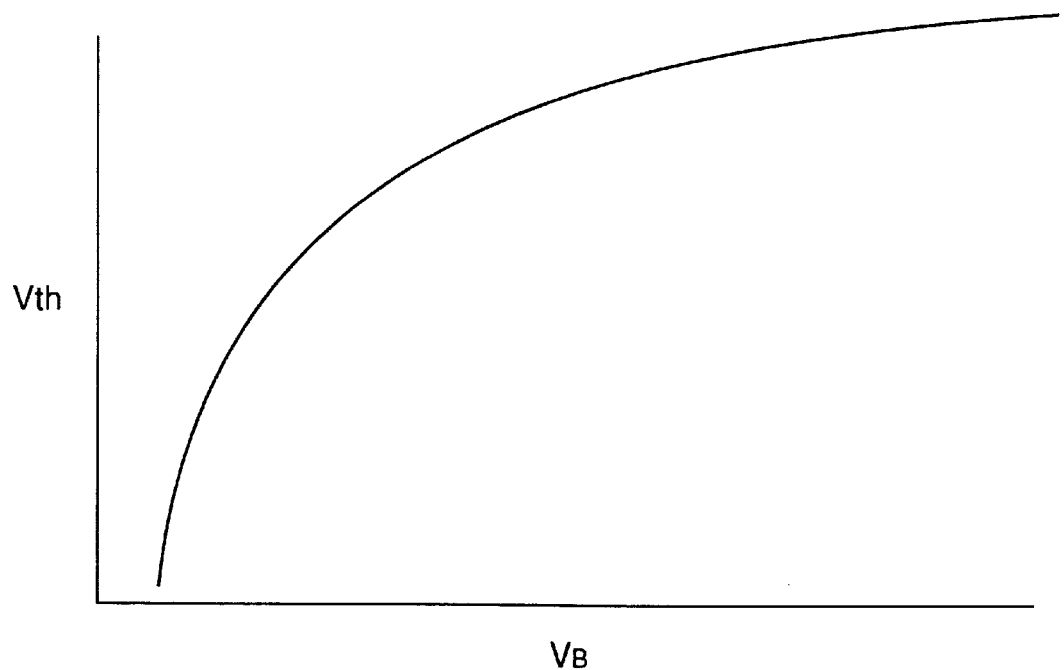
FIG. 36 is a graph showing a relation between substrate bias $V_B$ and threshold voltage Vth of the bulk-transistor of FIG. 35.
Figure 37:
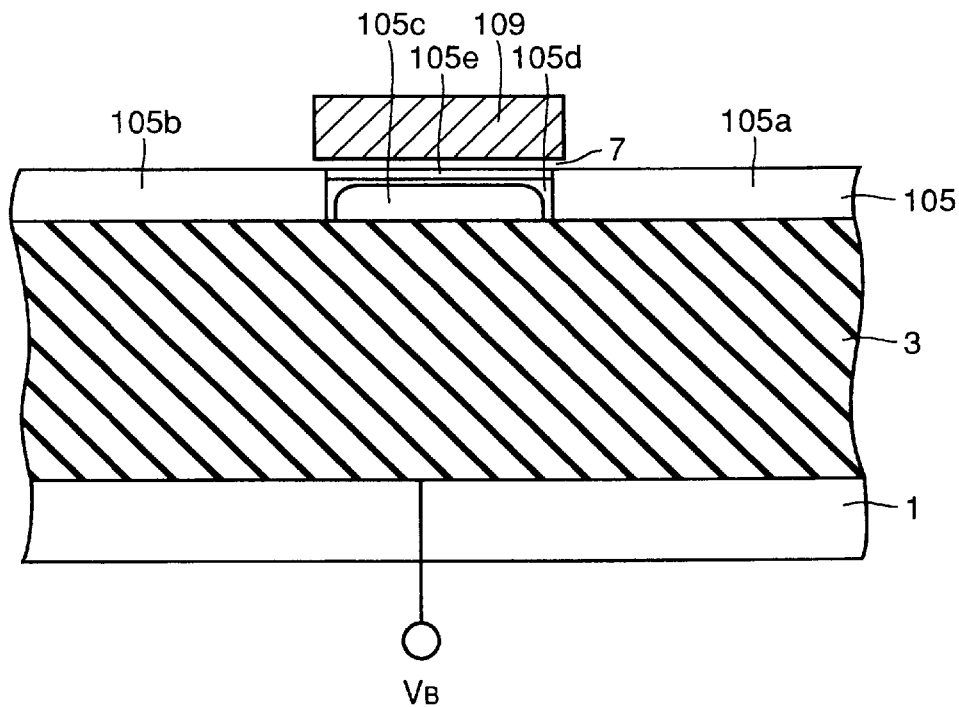
FIG. 37 is a cross section schematically showing a structure of an SOI-MOSFET to which substrate bias is applied via a buried insulating layer.
Figure 38:
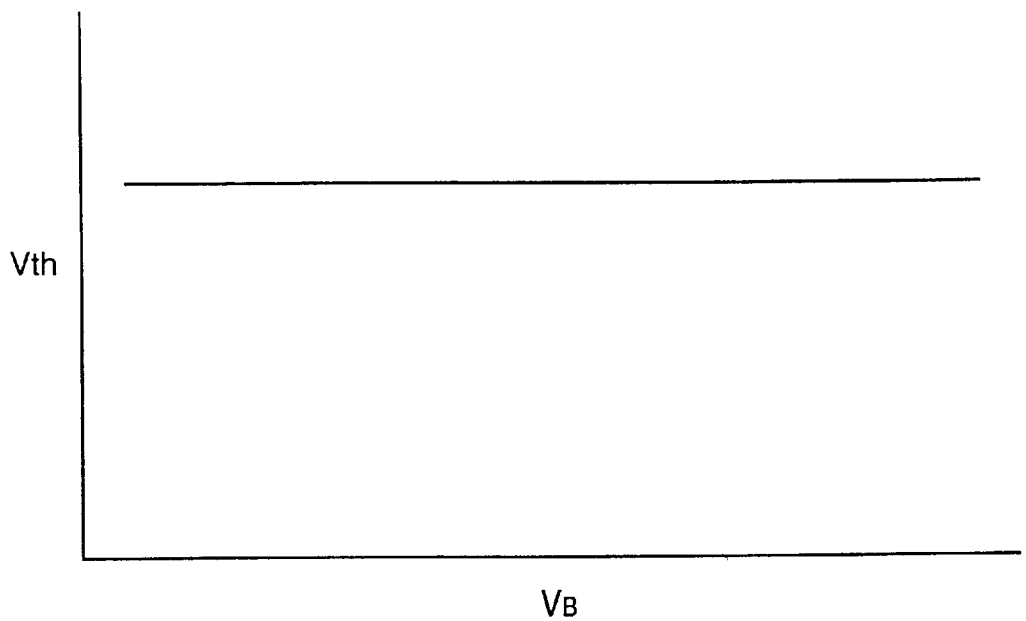
FIG. 38 is a graph showing a relation between substrate bias $V_B$ and threshold voltage Vth of a transistor when the substrate bias is applied via a buried insulating layer.
Figure 39:
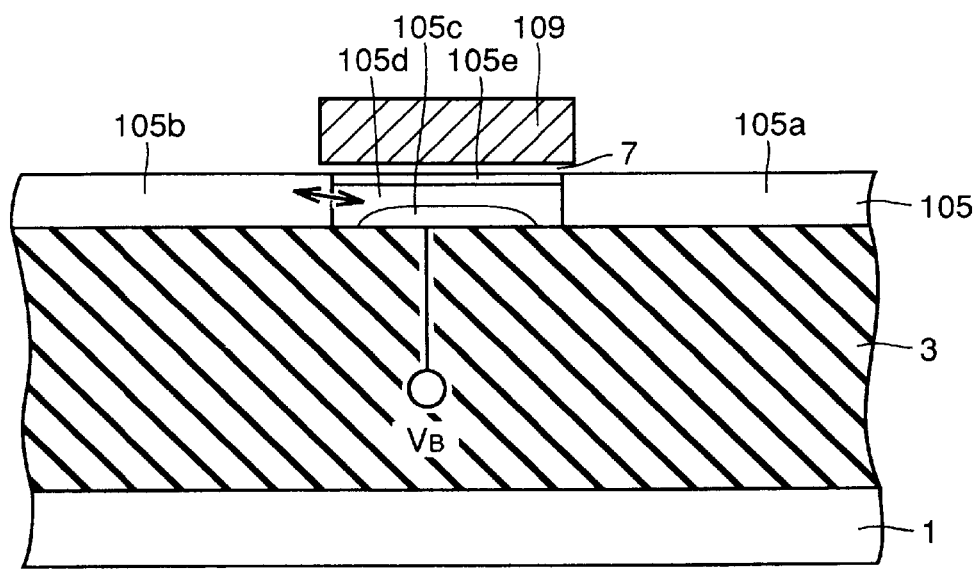
FIG. 39 is a cross sectional view schematically showing a structure of a body-fixed SOI-MOSFET.

Referring to FIGS. 8 and 9, in the region where substrate bias $V_B$ is relatively low, threshold voltage Vth increases with substrate bias $V_B$ similarly to the case of the bulk-transistor (FIG. 35, FIG. 36). However, if substrate bias $V_B$ is further increased, channel formation region 5c is entirely depleted (complete depletion) by a depletion layer 5dd extending from drain region 5a, a depletion layer 5ds extending from source region 5b, and a depletion layer 5dg extending from gate electrode layer 9. Even if substrate bias $V_B$ is increased to reach substrate bias $V_B$ or more causing the complete depletion, threshold voltage Vth is not affected by substrate bias $V_B$ and does not increase (saturated).

As shown in FIG. 8, depletion layer 5dg extends deeper compared with the case in which only depletion layer 5dg is present since depletion layer 5dg is sandwiched between depletion layers 5dd and 5ds extending from drain region 5a and source region 5b respectively and affected by them.

The influence of depletion layers 5dd and 5ds extending respectively from drain region 5a and source region 5b on depletion layer 5dg extending from gate electrode layer 9 is greater as the gate length is decreased. Therefore, if the thickness of SOI layer 5 is constant, channel formation region 5c is completely depleted faster as the channel length is smaller, and substrate bias $V_B$ when threshold voltage Vth is saturated is smaller.

Figure 10:
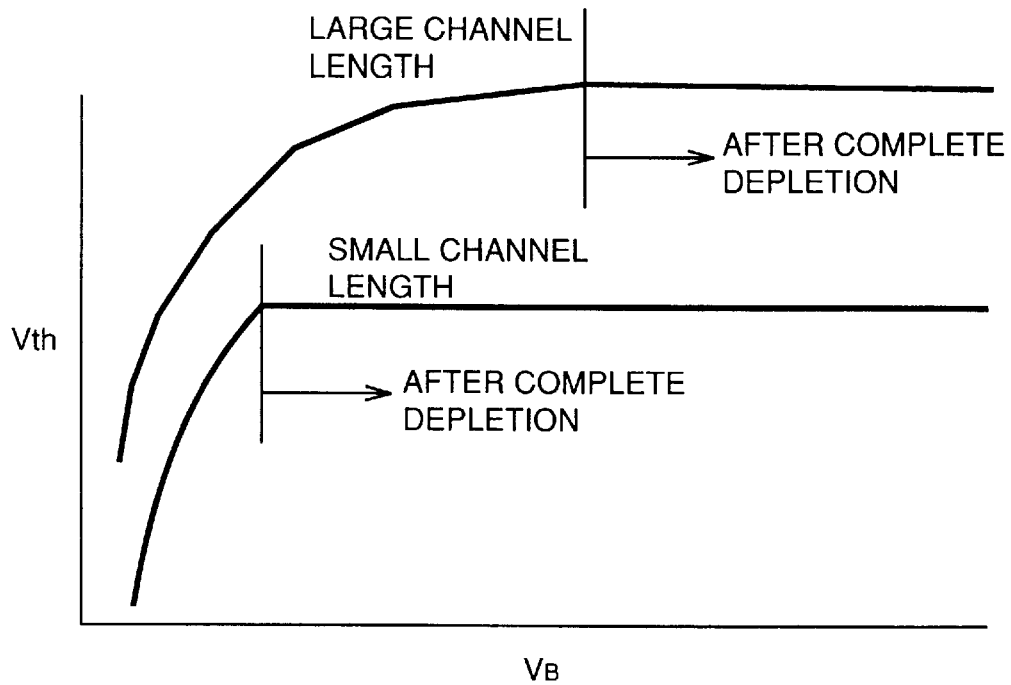
FIG. 10 is a graph showing a relation between substrate bias $V_B$ and threshold voltage Vth when the gate length of an SOI-MOSFET varies.

FIG. 10 shows change of threshold voltage Vth for two cases in which the thickness of SOI layer 5 is the same and the channel length is large and small. As clearly understood by FIG. 10, channel formation region 5c is completely depleted by a smaller substrate bias $V_B$ as the channel length is smaller.

According to this embodiment, the channel length at the narrowed portion of the edge portion J of channel formation region 5c is smaller than the channel length at the central portion K. Therefore, when substrate bias $V_b$ is applied from the body contact, edge portion J is completely depleted preceding depletion of the central portion K by a low substrate bias $V_b$. Even if substrate bias $V_b$ higher than that is applied, potential from the body contact is not transmitted into central portion K of prescribed region 5c. In other words, the potential from the body contact is blocked by the completely depleted edge portion J.

As a result, extension of a depletion layer is prevented at a junction between source/drain regions 5a and 5b and channel formation region 5c at central portion K, and threshold voltage Vth can be decreased. Since the threshold voltage Vth is decreased, drain current Id increases and high speed operation of an LSI is easily implemented. Further, reduction of supply voltage and power consumption is possible since threshold voltage Vth can be reduced.

Figure 11:
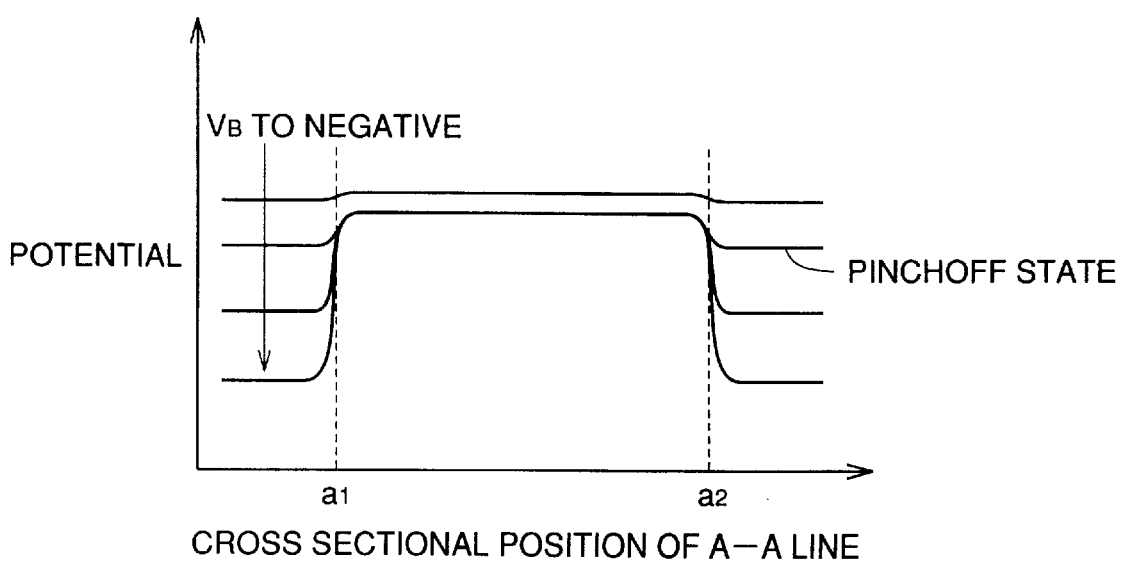
FIG. 11 is a graph showing change of the potential of a semiconductor layer along the A—A line of FIG. 1A when a narrowed portion is completely depleted.

FIG. 11 is a graph showing change of the potential at the bottom portion of the SOI layer corresponding to the cross ection of the A—A line of FIG. 1. Referring to FIG. 11, position $a_1$ and position $a_2$ correspond to those shown in FIG. 1. Specifically, the central portion is located in the region between positions $a_1$ and $a_2$, and the narrowed portion of the channel formation region is located on the opposite side of the central portion in relation to positions $a_1$ and $a_2$.

When substrate bias $V_B$ is changed to the negative side, the potential decreases in both of the central portion and the narrowed portion until the edge portion attains a pinchoff state. However, after the edge portion attains the pinchoff state, the potential of the central portion does not change and the potential of the narrowed portion decreases.

Figure 12:
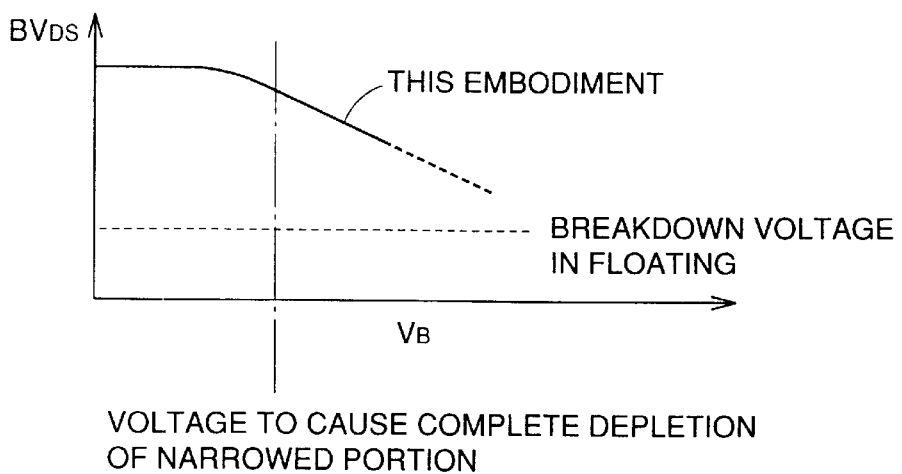
FIG. 12 is a graph showing a relation between substrate bias $V_B$ and source-drain breakdown voltage $BV_{DS}$ when a narrowed portion is completely depleted.

A relation between the source-drain breakdown voltage and the substrate bias in this case is shown in FIG. 12.

As understood by FIGS. 11 and 12, carriers (holes or electrons) generated by impact ionization in central portion K are drawn out from SOI layer 5 through the body contact until the edge portion J is completely depleted. Compared to the case of floating where carriers are not drawn out from the SOI layer, the number of carriers accumulated in central portion K after the narrowed portion is completely depleted can be reduced in this embodiment consequently, according to this embodiment, reduction of the source drain breakdown voltage caused by accumulation of carriers in SOI layer 5 can be prevented further than in a case where the SOI layer 5 remains floating.

In this embodiment, carriers in central portion K move from central portion K to the body contact to some extent by diffusion or recombination even after the narrowed portion is completely depleted. It also contributes to prevention of decrease of the source-drain breakdown voltage in this embodiment compared with the case in which the SOI layer is completely floating.

Consequently, according to this embodiment, an SOI-MOSFET having a superior-source drain breakdown voltage and a small substrate bias effect, and operating at high speed and with low power consumption can be obtained.

Although narrowed portions are formed at edge portions on both sides of central portion K in this embodiment, the narrowed portion may be formed at one location if the potential from the body contact can be blocked. For example, if the body contact is provided on one side only, the narrowed portion may be provided at one location on the body contact side.

Second Embodiment

The second embodiment relates to a method of forming a gate electrode layer having a narrowed portion without changing the conventional shape of the gate electrode pattern of the photomask.

Figure 13:
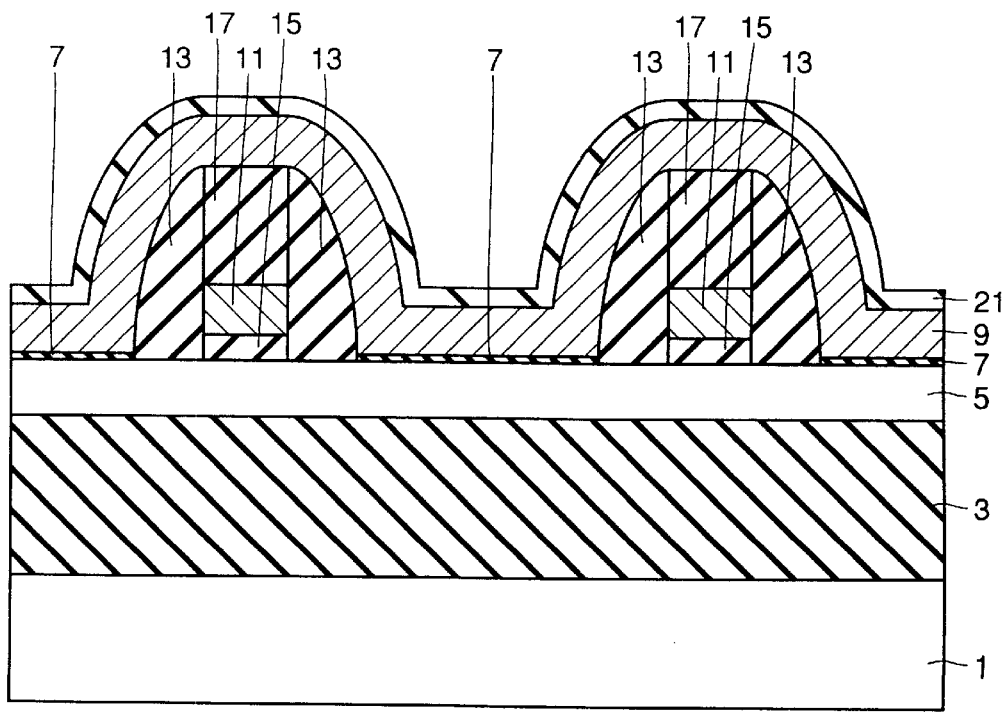
FIG. 13 and FIG. 14 are schematic cross sectional views along the A—A line of FIG. 1A showing a method of manufacturing a semiconductor device according to the second embodiment of the invention in the order of steps.
Figure 14:
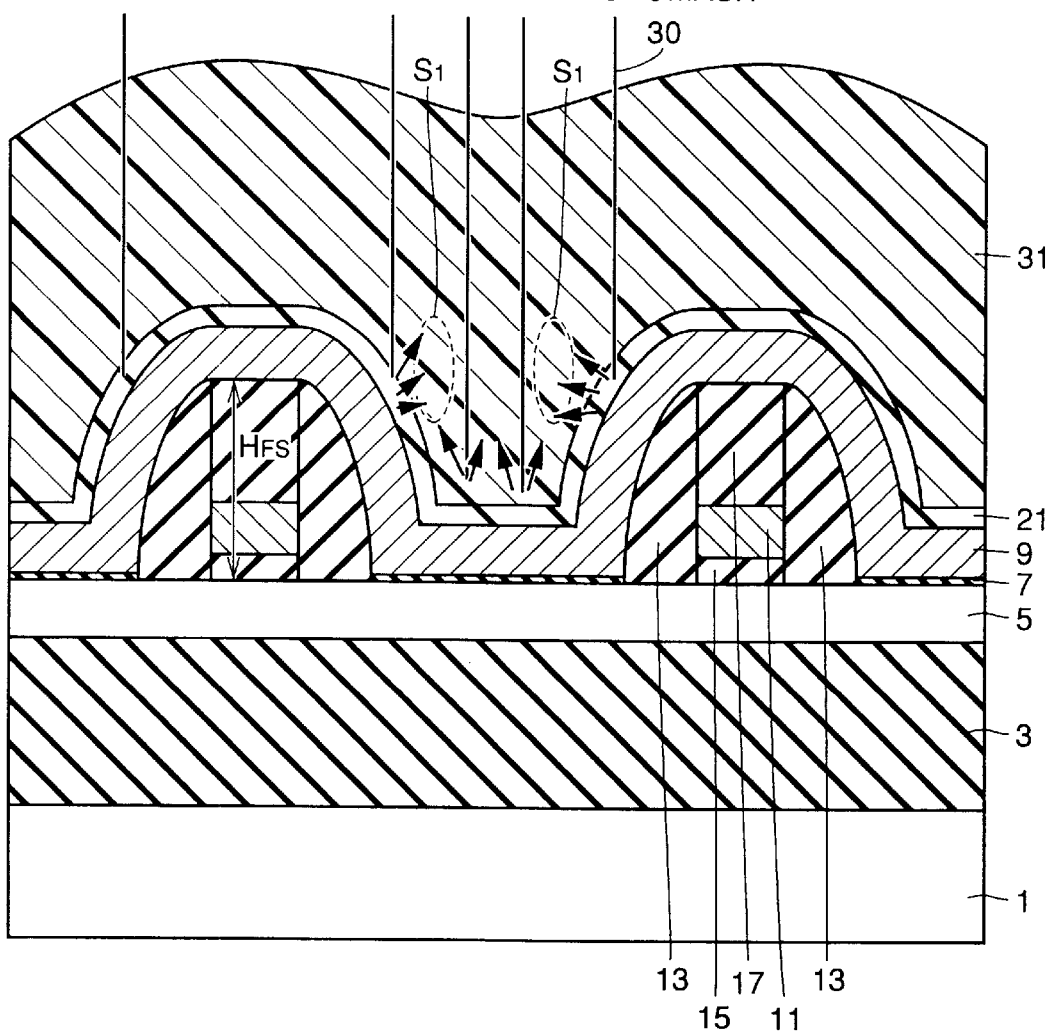

FIGS. 13 and 14 are schematic cross sections along the A—A line of FIG. 1 showing a method of manufacturing a semiconductor device according to the second embodiment of the invention in order of steps.

The manufacturing method according to this embodiment has manufacturing steps similar to those of the first embodiment shown in FIGS. 2–6. Referring to FIG. 13, a reflection film 21 for enhancing reflection intensity is formed at the entire surface of a conductive layer 9 which is to be a gate electrode layer.

Referring to FIG. 14, a photoresist 31 of the positive type, for example, is applied onto the entire surface of reflection film 21. Photoresist 31 is irradiated by exposure light 30 which is passed through a photomask from a stepper. Reflection film 21 covers a step portion of the FS isolation structure and causes irregular reflection of exposure light 30 at a step portion of a sidewall of reflection film 21. This irregular reflection increases the intensity of the exposure light at region $S_1$ in the vicinity of a step portion of photoresist 31. The positive photoresist is removed by development in a region which is irradiated by the light, so that photoresist 31 is excessively removed in the vicinity of region $S_1$ where the intensity of the exposure light is high, and the shape of the resist pattern in the vicinity of region $S_1$ is narrowed.

Consequently, the width of the resist pattern is reduced near the FS isolation structure or on the edge of the channel formation region. A gate electrode layer 9 having a narrowed portion on the edge portion of channel formation region is thus formed by etching reflection film 21 and conductive layer 9 using resist pattern 31 as a mask.

Further, by injecting impurities using gate electrode layer 9 as a mask to form the source and drain regions, the channel length at the edge portion of the channel formation region sandwiched between the source and drain regions becomes smaller than that at the central portion.

The gate electrode layer and the channel formation region each having the narrowed portion at the edge portion can be formed using a gate pattern shape of a conventional photomask, by providing reflection film 21 on conductive layer 9 that is to be the gate electrode layer.

Reflection by reflection film 21 is determined by the wavelength of exposure light, the thickness and refractive index of reflection film 21. Suppose that the material of reflection film 21 is a silicon nitride film, refractive index n of reflection film 21 for a resist is 1.4, and i-line (wavelength:365 nm) is used as exposure light, for example, the intensity of reflection for exposure light is highest when reflection film 21 is formed to have a thickness of approximately 635 Å.

For the structure shown in FIG. 14, a relation between height $H_{FS}$ and reduction of the pattern width (width that is removed extra) of the field isolation structure is examined regarding two cases in which reflection film 21 is present and absent. The result is shown in FIG. 15.

Figure 15:
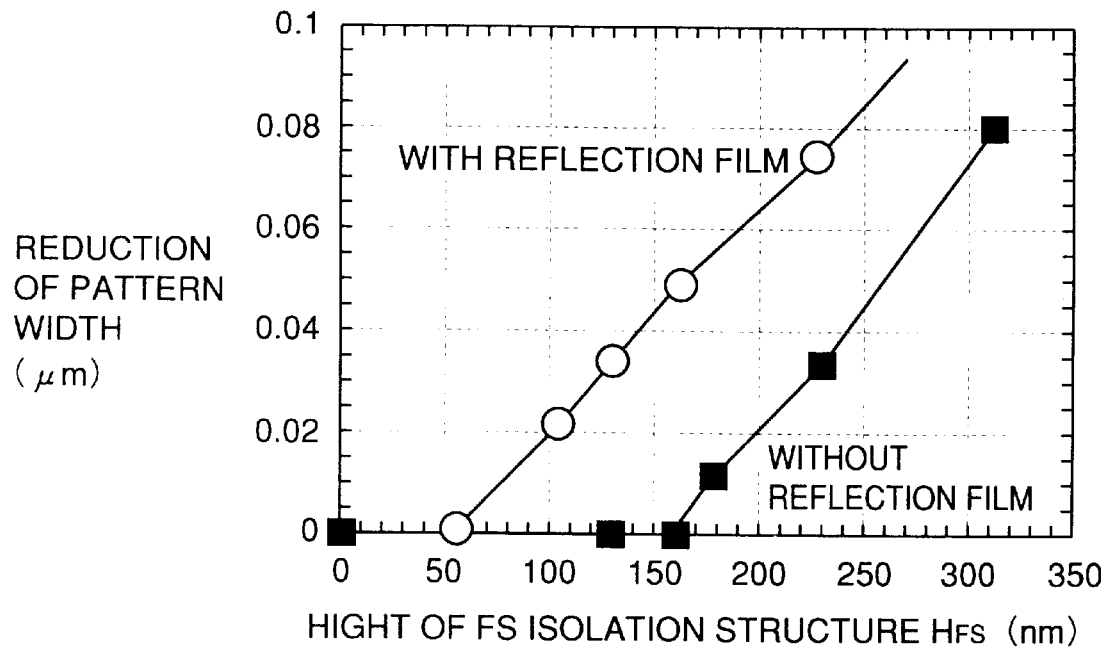
FIG. 15 is a graph showing a relation between a size of a step of an FS portion and reduction of a pattern width when there is a reflection film on a gate electrode layer and when there is no reflection film thereon.

Referring to FIG. 15, the result clearly shows that the pattern can be narrowed further with reflection film 21 than without reflection film 21 if height $H_{FS}$ of the field shield isolation structure is the same. In other words, by providing reflection film 21, gate electrode layer 9 having a gate length which is sufficiently small at the narrowed portion can be obtained by providing reflection film 21 even if height $H_{FS}$ of the field shield isolation structure is decreased.

Although the pattern can be narrowed even if the reflection film is not provided, by increasing height $H_{FS}$ of the FS isolation structure, a step at the surface increases to cause problems of disconnection of a conductive layer formed thereon, short circuit due to residue, and the like.

Third Embodiment

The third embodiment relates to a method of forming a gate electrode layer having a minute gate length on a narrowed portion by manipulation of a gate electrode pattern of a photomask.

Figure 16:
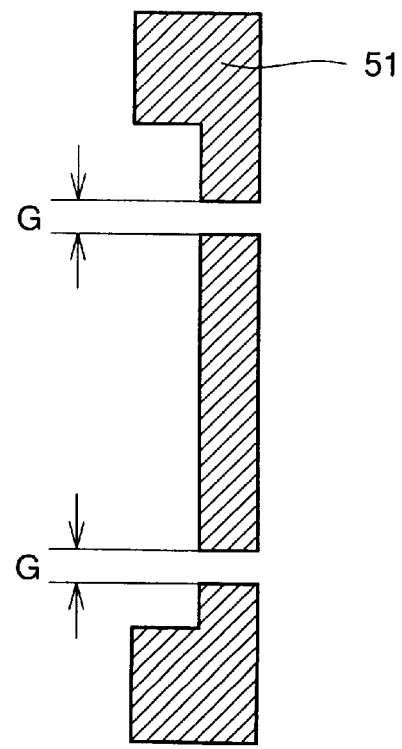
FIG. 16 is a schematic plan view showing a shape of a gate electrode pattern of a photomask used for forming a gate electrode layer of a semiconductor device according to the third embodiment of the invention.
Figure 17:
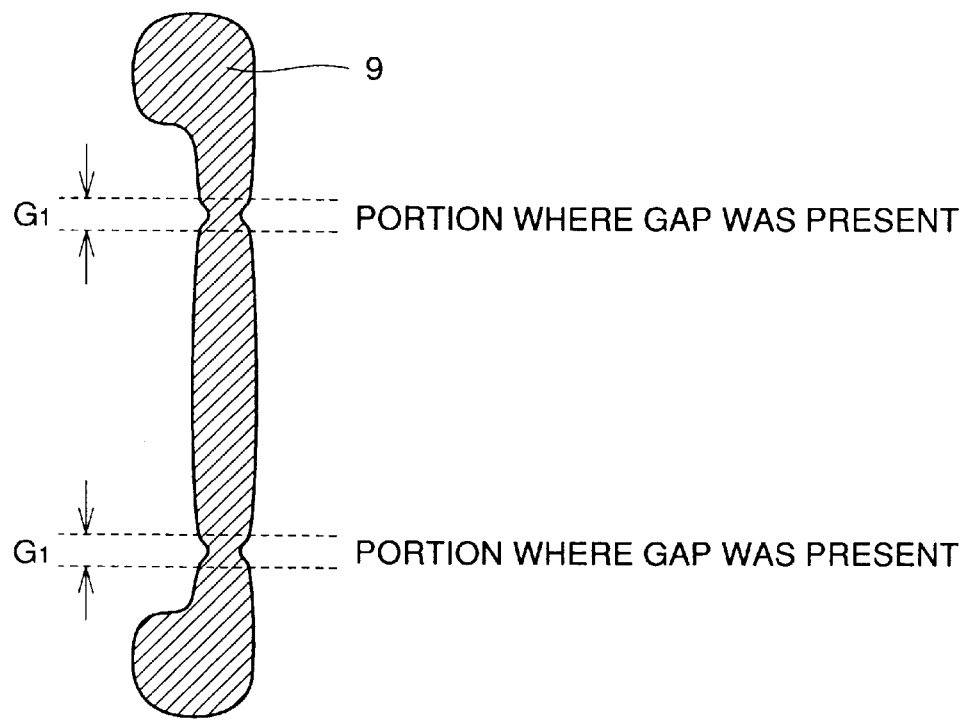
FIG. 17 is a schematic plan view showing a shape of a gate electrode layer when the gate electrode layer is formed using the photomask having the pattern shown in FIG. 16.

FIG. 16 is a schematic plan view showing a structure of the gate electrode pattern of the photomask for patterning a gate electrode layer of a semiconductor device according to the third embodiment of the invention. Referring to FIG. 16, a gate electrode pattern 51 has a gap G having resolution equals to or smaller than that of a stepper, at a location corresponding to a narrowed portion of a channel formation region. When gate electrode pattern 51 is transferred to a conductive layer which is to be a gate electrode on a wafer, the gap portion of gate electrode pattern 51 disappears due to the proximity effect. As a result, gate electrode layer 9 having its width narrower at the portion where the gap was present than at other portions can be obtained as shown in FIG. 17.

Gate electrode layer 9 is patterned using gate electrode pattern 51 having gap G, and a narrowed portion having a minute gate length can be formed.

Fourth Embodiment

Figure 18:
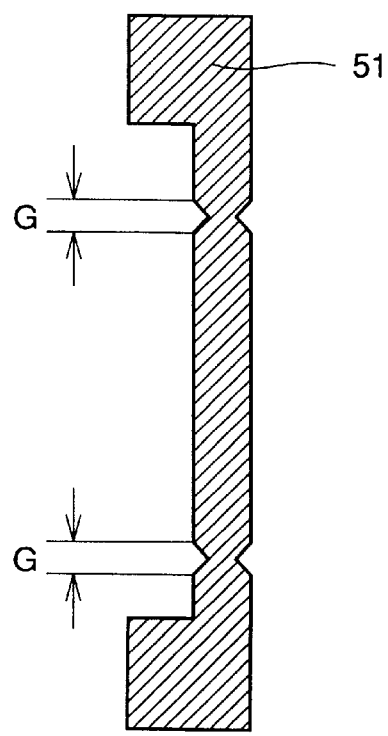
FIG. 18 and FIG. 19 are schematic plan views showing various shapes of a gate electrode pattern of a photomask when a gate electrode layer of a semiconductor device according to the fourth embodiment of the invention is formed.
Figure 19:
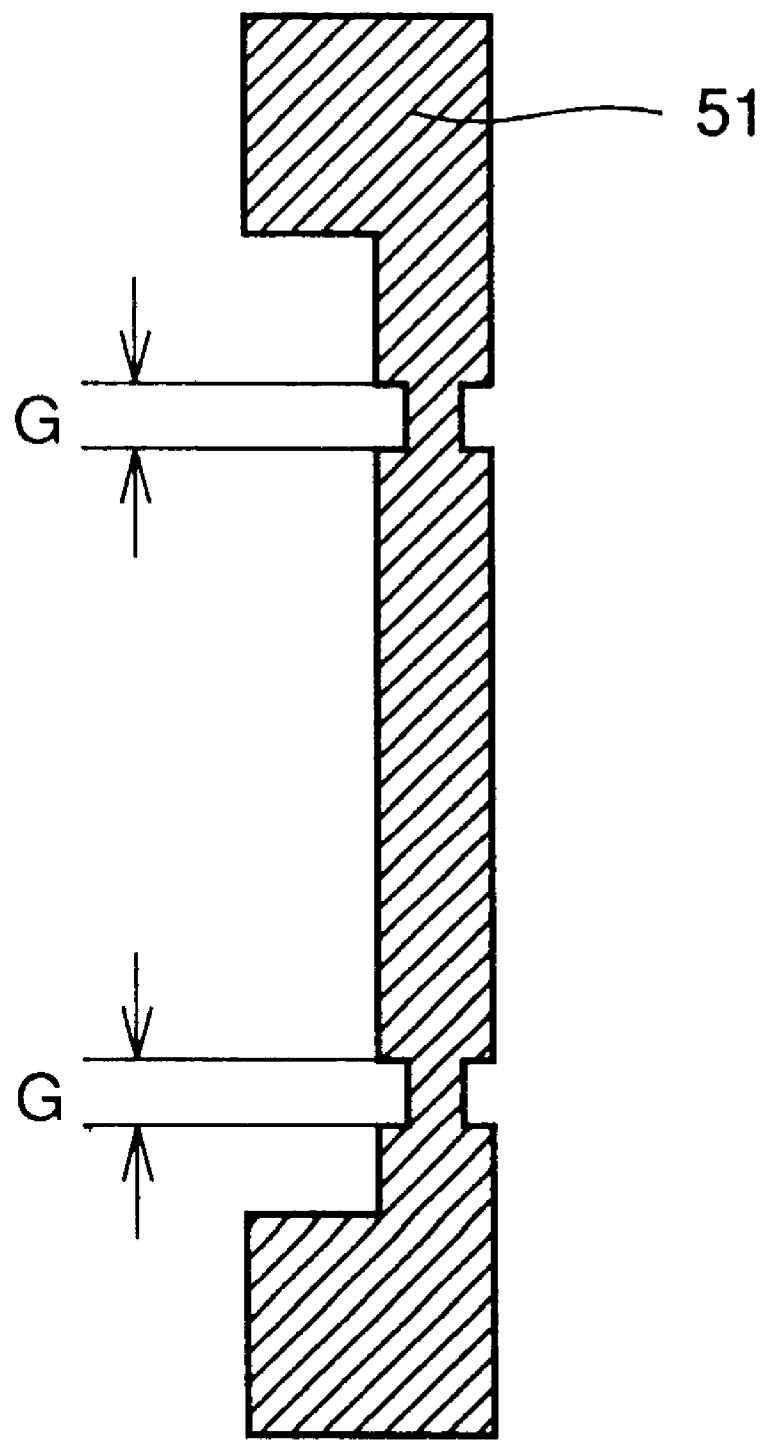

FIGS. 18 and 19 are schematic plan views each showing a structure of a gate electrode pattern of a photomask for patterning a gate electrode layer of a semiconductor device according to the fourth embodiment of the invention.

Referring to FIGS. 18 and 19, a gate electrode pattern 51 of a photomask may have a narrowed portion formed instead of a gap at a location corresponding a narrowed portion of a channel formation region. By setting width G of the narrowed portion to a dimension of at most resolution of a stepper, an advantage similar to that described above can be achieved.

The shape of a notch to form the narrowed portion may be triangle (FIG. 18) or rectangular (FIG. 19) as shown in FIGS. 18 and 19. The shape of the notch region is not limited to those shapes, and may be polygonal or a curved shape.

Fifth Embodiment

If a region having a short channel length (narrowed portion) is provided at a part of a channel formation region as that according to the first to the fourth embodiments described above, punch-through could easily occur, and short channel effect could become severe.

This embodiment relates to a structure which has a narrowed portion at a channel region but which is immune to short channel effect.

Figure 20:
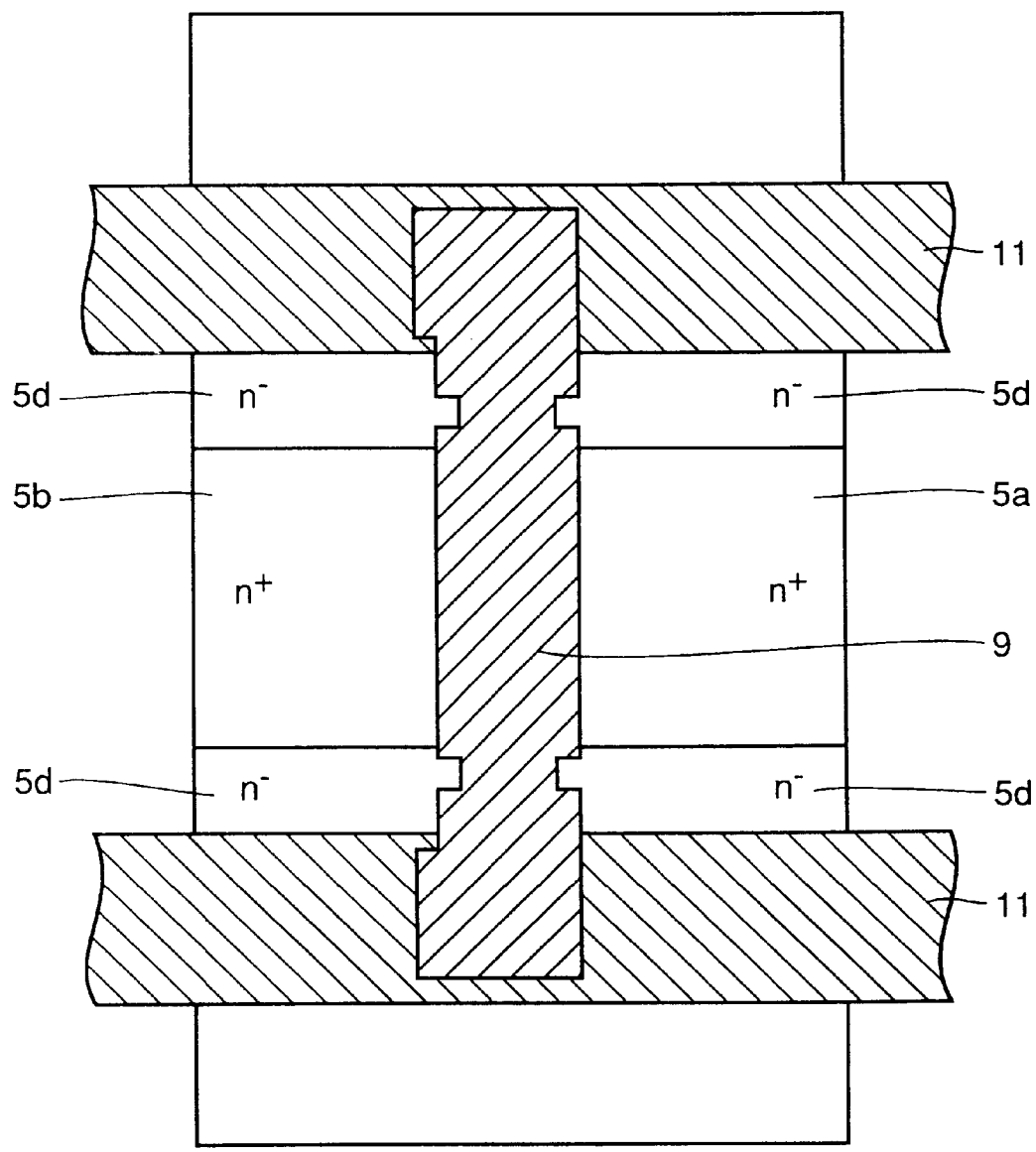
FIG. 20 and FIG. 21 are schematic plan views showing a method of manufacturing a semiconductor device according to the fifth embodiment of the invention in the order of steps.

FIG. 20 is a plan view schematically showing a structure of a semiconductor device according to the fifth embodiment of the invention. Referring to FIG. 20, $n^+$ impurity regions 5d of relatively low concentration are formed on both sides of a narrowed portion of a channel formation region located under a gate electrode layer 9. On both sides of a central portion of the channel formation region, $n^+$ impurity regions 5a and 5b of relatively high concentration are formed.

The relatively low impurity concentration of $n^+$ impurity region 5d increases parasitic resistance. Therefore, current flowing between the source/drain when a transistor is turned on chiefly flows between $n^+$ impurity regions 5a and 5b, and scarcely flows between $n^-$ impurity regions 5d on both sides of the narrowed portion.

Current scarcely flows on both sides of the narrowed portion which could deteriorate a short channel feature when the transistor is turned on, so that the punch-through is not easily caused and an SOI-MOSFET superior in the short channel effect can be obtained.

Figure 21:
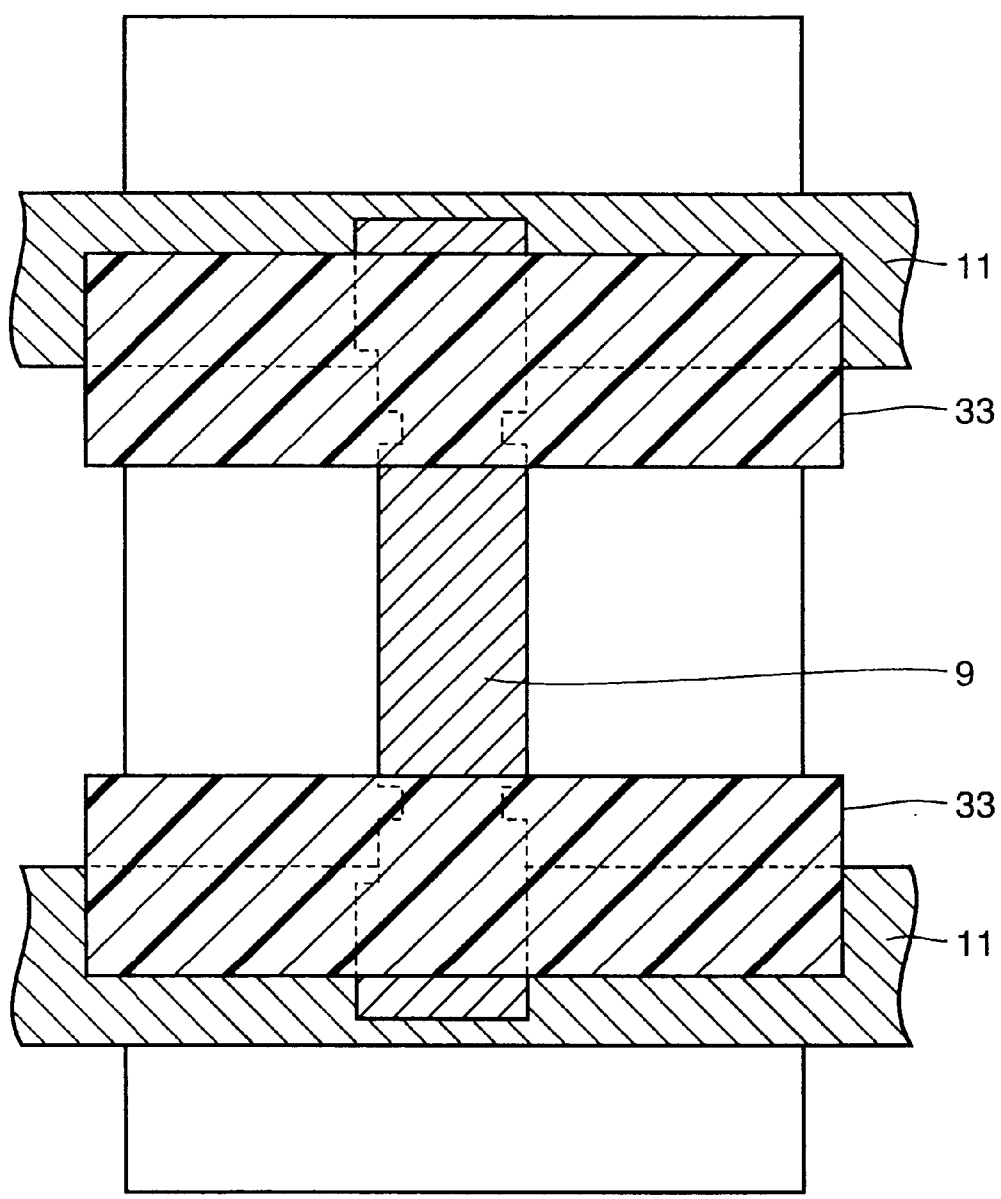

FIG. 21 is a schematic plan view showing a method of manufacturing the semiconductor device according to the fifth embodiment of the invention. According to the method of manufacturing of this embodiment, a step of forming gate electrode layer 9 and preceding steps shown in FIG. 2 to FIG. 7 are executed. Ion implantation of n-type impurities is carried out using gate electrode layer 9, an FS isolation structure, and the like as a mask, and an n impurity region is formed at an SOI layer.

An insulation layer (not shown) is thereafter formed at the entire surface. A resist pattern 33 is formed on the insulating layer to cover at least a narrowed portion of gate electrode layer 9 and portions on both sides thereof, and the underlying insulating layer is anisotropically etched using resist pattern 33 as a mask. Consequently, a sidewall insulating layer (not shown) covering the narrowed portion and the portions on both sides of gate electrode layer 9 and covering a sidewall of gate electrode layer 9 is formed. N⁺ impurity regions 5a and 5b are formed by ion implantation of n-type impurities using the sidewall insulating layer, gate electrode layer 9, the FS isolation structure and the like as a mask. As a result, the semiconductor device of FIG. 20 is obtained.

When a semiconductor device is manufactured by the method described above, portions on both sides of the narrowed portion of the channel formation region are covered with the same film (e.g. $SiO_2$) as that of the sidewall insulating layer of gate electrode layer 9. Therefore, even if silicidation processing causes silicidation of the surface of n⁺ impurity region 5a, silicidation of the surface of n⁻ impurity region 5d never occurs. Accordingly, the resistance of n⁻ impurity region 5d is not reduced by the silicidation and the problem of the short channel effect caused by the reduced resistance is avoided.

N⁺ impurity regions 5a and 5b may be formed by providing a sidewall insulating layer covering a sidewall of gate electrode layer 9, forming resist pattern 33 as shown in FIG. 21 and injecting n-type impurities after formation of n⁻ impurity region 5d.

This method is applicable to a pMOSFET if the conductivity type is reversed to change n⁺ to p⁺ and n⁻ to p⁻.

Sixth Embodiment

This embodiment is a modification of the fifth embodiment and does not require an additional photomask.

Figure 22A:
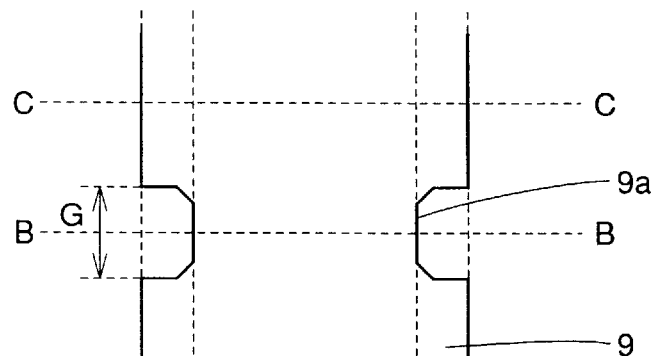
FIG. 22A is a schematic plan view showing a narrowed portion of a gate electrode layer of a semiconductor device according to the sixth embodiment of the invention by enlarging it.
Figure 22B:
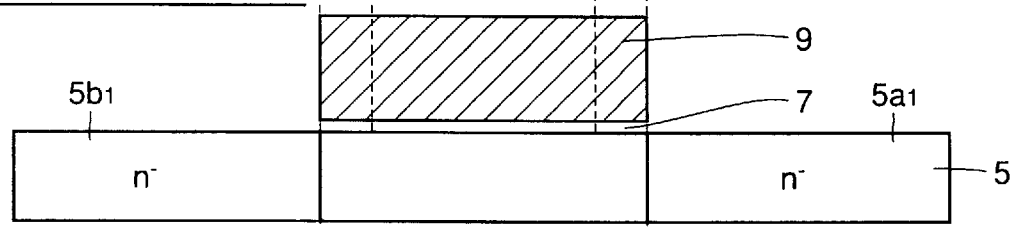
FIG. 22B is a schematic cross section along the C—C line of FIG. 22A.
Figure 22C:
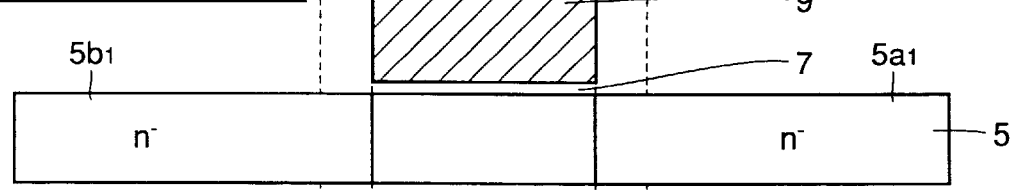
FIG. 22C is a schematic cross section along the B—B line of FIG. 22A.
Figure 23A:
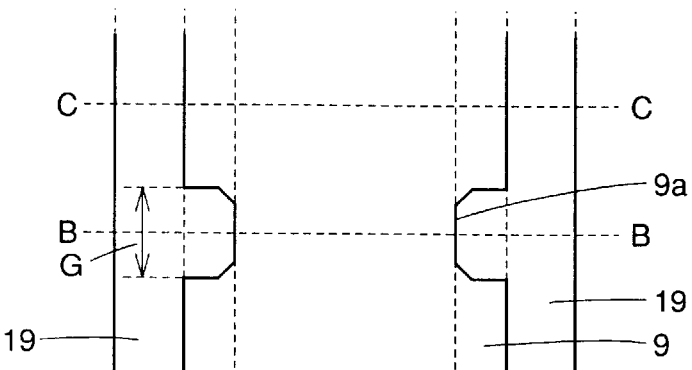
FIG. 23A is a schematic plan view showing that a sidewall insulating layer of the semiconductor device of the sixth embodiment of the invention is formed.
Figure 23B:
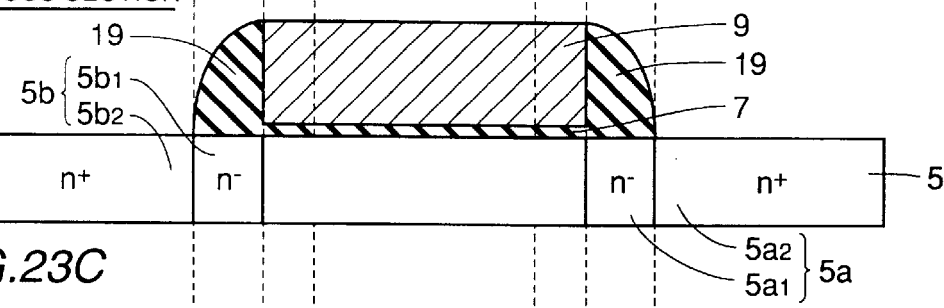
FIG. 23B is a schematic cross section along the C—C line of FIG. 23A.
Figure 23C:
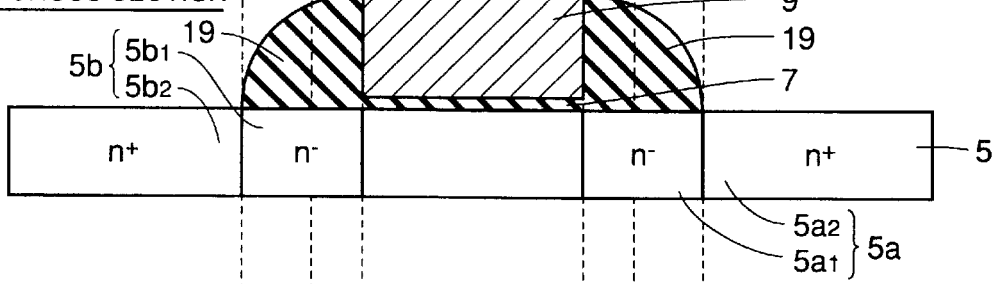
FIG. 23C is a schematic cross section along the B—B line of FIG. 23A.

FIG. 22A and FIG. 23A are schematic plan views each illustrating an enlarged narrowed portion of a gate electrode layer, showing a method of manufacturing a semiconductor device of the sixth embodiment of the invention in order of steps. In addition, FIGS. 22B and 22C are schematic cross sections respectively along the C—C line and B—B line of FIG. 22A. FIGS. 23B and 23C are schematic cross sections along the C—C line and B—B line respectively of FIG. 23A.

Referring to FIGS. 22A, 22B and 22C, n impurity regions $5a_1$ and $5b_1$ to be a drain region and a source region are formed at an SOI layer 5 by injection of n-type impurities using a gate electrode layer 9 and the like as a mask.

Referring to FIGS. 23A, 23B and 23C, an insulating layer 19 is formed to cover the entire surface. The thickness of insulating layer 19 is at least ½ of the maximum width G of a narrowed portion 9a of gate electrode layer 9. A sidewall insulating layer 19 covering a sidewall of gate electrode layer 9 is formed by anisotropically dry etching insulating layer 19. N⁺ impurity regions $5a_2$ and $5b_2$ are formed at SOI layer 5 by injection of n-type impurities using gate electrode layer 9, sidewall insulating layer 19 and the like as a mask.

A drain region 5a of an LDD (Lightly Doped Drain) structure is formed of n impurity region $5a_1$ and n⁺ impurity region $5a_2$, and a source region 5b of the LDD structure is formed of n impurity region $5b_1$ and n⁺ impurity region $5b_2$.

Insulating layer 19 is formed with its thickness of at least ½ of the maximum width G of narrowed portion 9a, so that the shape of the plane of sidewall insulating layer 19 formed of insulating layer 19 is almost in a straight line and a narrowed portion is not generated correspondingly to narrowed portion 9a. N⁺ impurity regions $5a_2$ and $5b_2$ are formed using sidewall insulating layer 19 and the like as a mask, so that the widths in the channel length direction of n⁺ impurity regions $5a_1$ and $5b_1$ is larger at the cross section of narrowed portion 9a (FIG. 23C) than at the cross section of the central portion (FIG. 23B).

The widths of n impurity regions $5a_1$ and $5b_1$ in the channel length direction on both sides of narrowed portion 9a are larger to increase parasitic resistance of n⁻ impurity regions $5a_1$ and $5b_1$. Therefore, current chiefly flows in a portion other than narrowed portion 9a of the central portion when a transistor is turned on. The transistor is thus never easily affected by the short channel effect. According to this embodiment, an SOI-MOSFET which is immuned to the punch-through is obtained without increasing the number of masks for transistor formation.

If sidewall insulating layer 19 should be made thinner, there is a method of reducing the width of the sidewall insulating layer by wet etching or the like, after forming an insulating film 19 with a thickness of at least ½ of the maximum width G of narrowed portion 9a and burying narrowed portion 9a as described above.

Seventh Embodiment

According to the first to the sixth embodiments, the narrowed portion having a small width in the channel length direction is provided to channel formation region 5c to cause complete depletion of the narrowed portion prior to depletion of any other portion (central portion). According to this embodiment, a technique for completely depleting a part of an SOI layer prior to depletion of other parts by reducing the thickness of the part of the SOI layer to be smaller than that of the other parts.

Figure 24:
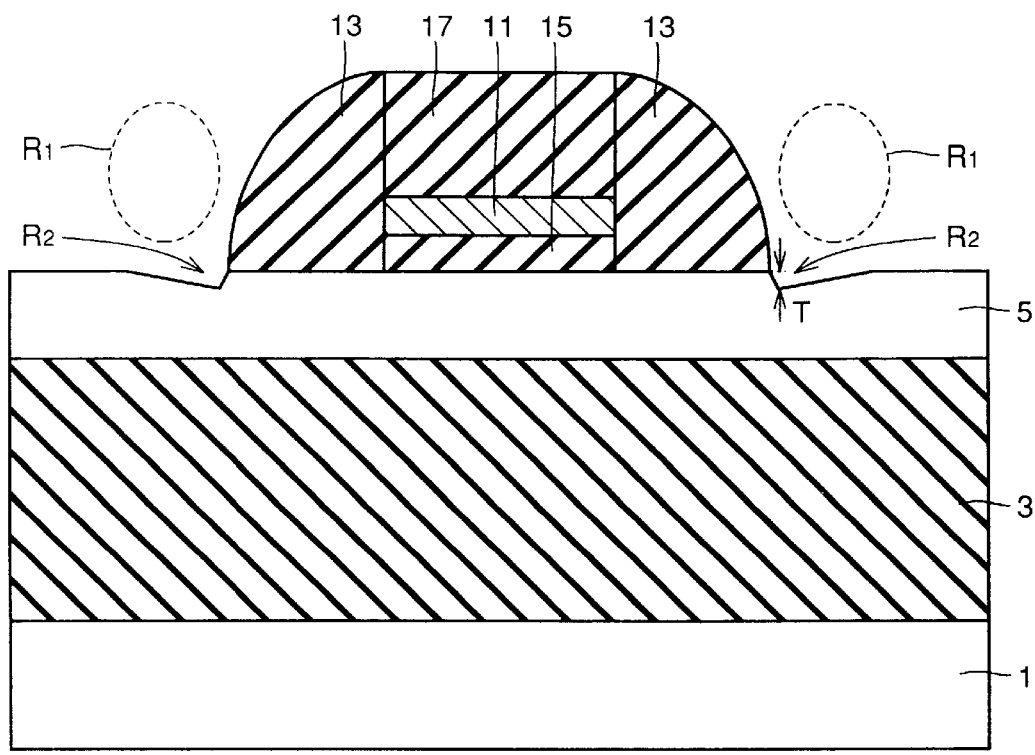
FIGS. 24–26 are partial schematic cross sections along the A—A line of FIG. 1A showing a method of manufacturing a semiconductor device according to the seventh embodiment of the invention in the order of steps.
Figure 25:
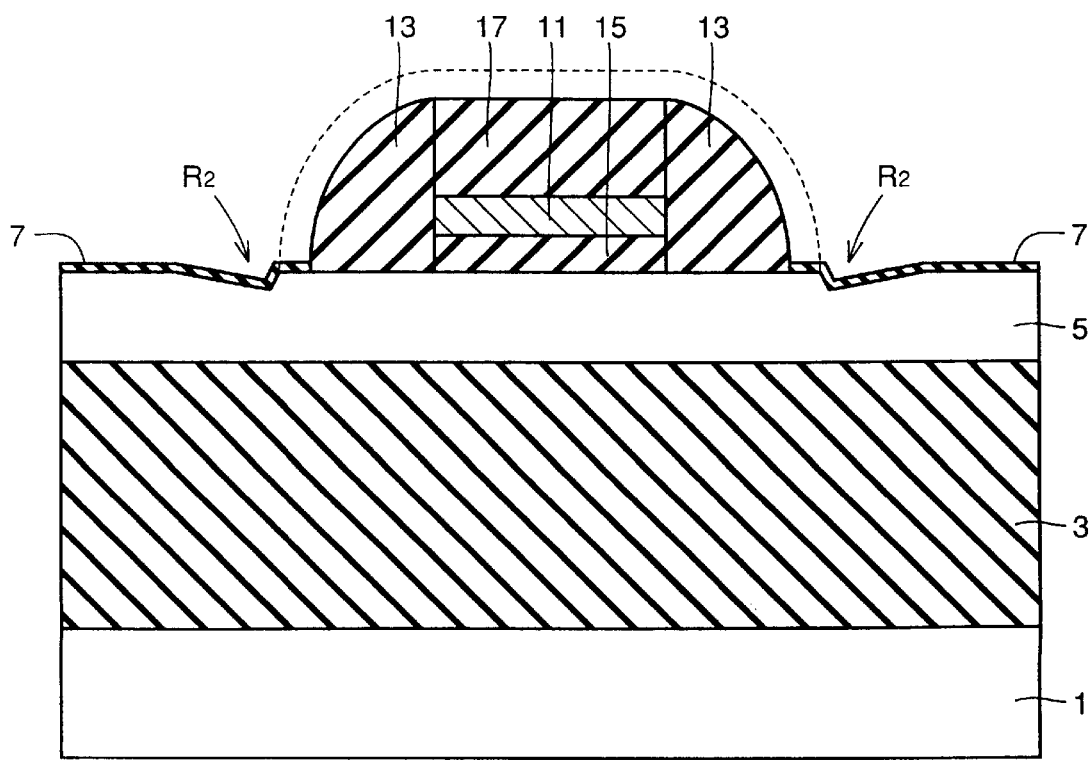
Figure 26:
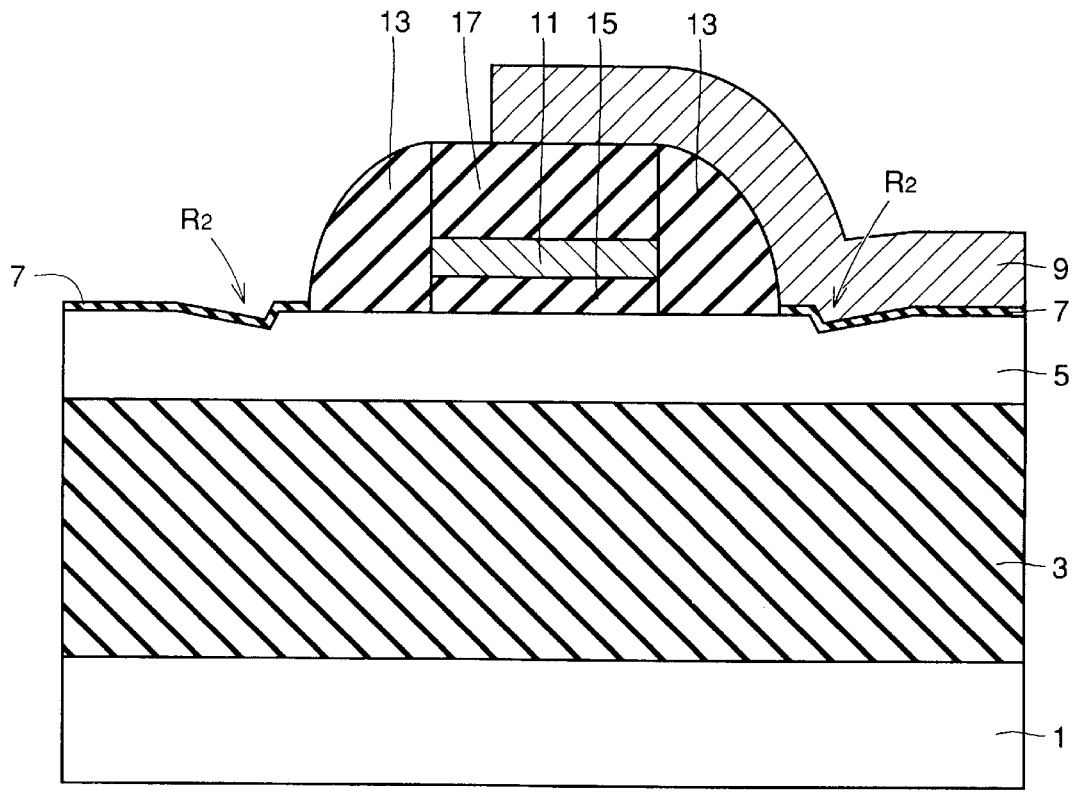

FIGS. 24–26 are partial schematic cross sections along the A—A line of FIG. 1A showing a method of manufacturing a semiconductor device according to the seventh embodiment of the invention in order of steps.

According to the manufacturing method of this embodiment, steps similar to those of the first embodiment shown in FIGS. 2–4 are carried out. Referring to FIG. 24, overetch of at least 50% is performed when anisotropic etching is applied for forming a sidewall insulating layer 13 constituted of a silicon oxide film. Specifically, when a silicon oxide film is used as an insulating layer for forming sidewall insulating layer 13 and a silicon layer is used as an SOI layer 5, the etch selectivity ($SiO_2$:Si) when the anisotropic etching is carried out is approximately 10:1. If insulating layer 13 for forming sidewall insulating layer 13 is fabricated with a thickness of 2000 Å, a trench $R_2$ having its depth T of at least 100 Å is formed at SOI layer 5 by overetch of 50% carried out for forming sidewall insulating layer 13.

If the overetching for formation of sidewall insulating layer 13 is performed to a higher degree, SOI layer 5 at the edge of the FS isolation is especially deeply overetched to be removed. This is caused by a characteristic that the plasma as the etchant of dry etching concentrates at region $R_1$ above the edge portion.

Overetch of anisotropic etching for formation of normal sidewall insulating layer 13 is approximately 10%. Therefore, depth T of trench $R_2$ formed at SOI layer 5 is normally about 20 Å at most.

Although the deep trench $R_2$ is formed by increasing the degree of overetching in the above description, depth T of trench R2 may be increased by setting the etch rate of SOI layer 5 and sidewall insulating layer 13 to values close to each other. Alternatively, the etch selectivity of sidewall insulating layer 13 and SOI layer 5 may be changed only for the vicinity of the end point of etching for formation of sidewall insulating layer 13.

Referring to FIG. 25, trench $R_2$ is separated from the edge of sidewall insulating layer 13 by applying wet etching to recess sidewall insulating layer 13 and an insulating layer 17 covering an FS plate 11 to a some degree. A gate insulating layer 7 is thereafter formed at the surface of SOI layer 5 by thermal oxidation process or the like.

When trench $R_2$ is located near the edge of sidewall insulating layer 13 as shown in FIG. 24, stress is likely to concentrate at this portion when gate insulating layer 7 is formed. This may cause leakage current. Therefore, trench $R_2$ is preferably separated from the edge of sidewall insulating layer 13.

Referring to FIG. 26, a gate electrode layer 9 is formed to be opposite to SOI layer 5 with gate insulating layer 7 therebetween.

The film thickness of SOI layer 5 is partially reduced by providing trench $R_2$ at a part as described above. As a result, the region having a smaller thickness located at the edge of the channel formation region is first depleted completely when substrate bias is applied, and application of the substrate bias to the central portion is prevented. Increase of threshold voltage of a transistor can be avoided accordingly.

If the substrate bias is not applied, the body fix is possible via SOI layer 5 under FS plate 11.

According to this embodiment, partial reduction of the channel length is unnecessary and an SOI-MOSFET having a superior short channel characteristic can be obtained.

Eighth Embodiment

This embodiment relates to a modification of the sixth embodiment.

Figure 27:
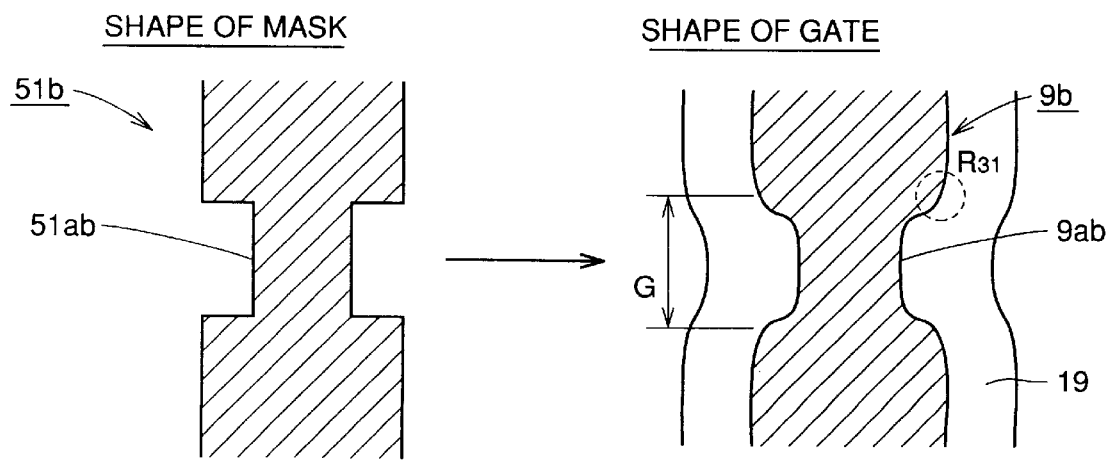
FIG. 27 is a schematic plan view of a mask and a gate electrode showing that a narrowed portion of the gate electrode cannot be successfully buried by sidewalls.

If a gate electrode pattern 51b of a photomask having a narrowed portion 51ab is transferred onto a wafer as shown in FIG. 27, a narrowed portion 9ab of a gate electrode layer 9b on the wafer has a blurred shape. Particularly the shape of an opening end $R_{31}$ of narrowed portion 9ab is blurred, and width G of narrowed portion 9ab is substantially increased. Therefore, a narrowed portion of a sidewall insulating layer 19 formed at a sidewall of gate electrode layer 9b tends to be produced at a location corresponding to narrowed portion 9ab of gate electrode layer 9b. As a result, a transistor is easily affected by the short channel effect as described above.

Figure 28:
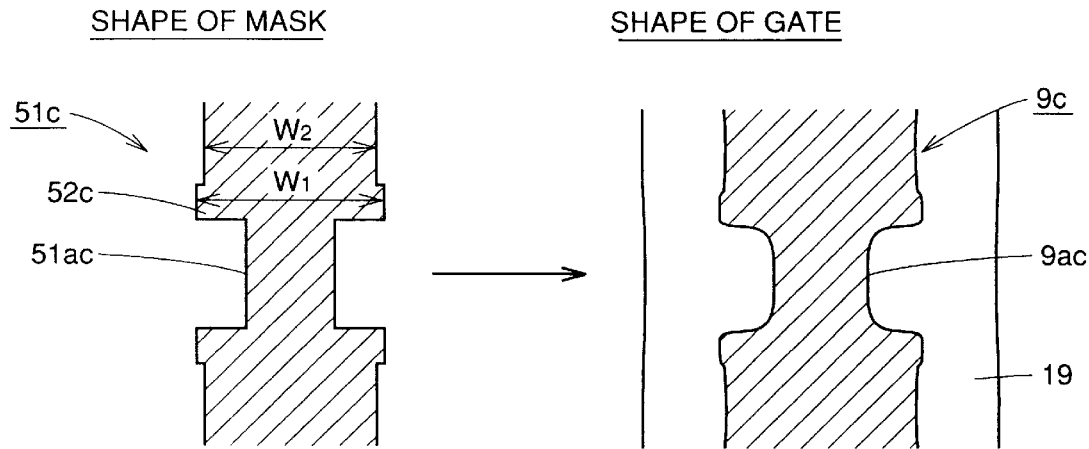
FIG. 28 and FIG. 29 are schematic plan views of a mask and a gate electrode showing that a narrowed portion of a gate electrode layer can be successfully buried by sidewalls of a semiconductor device according to the eighth embodiment of the invention.

According to this embodiment, a wide portion 52c is provided in the vicinity of the end of the opening of a narrowed portion 51ac of a gate electrode pattern 51c of a photomask as shown in FIG. 28. Wide portion 52c has width W1 larger than length W2 of another region.

When gate electrode layers 9c and 9d are formed using the photomask having such a shape, increase of the width at the edge of the openings of narrowed portions 9ac and 9ad of gate electrode layers 9c and 9d is prevented. Accordingly, narrowed portion 9ac can be successively buried at a sidewall insulating layer 19.

Figure 29:
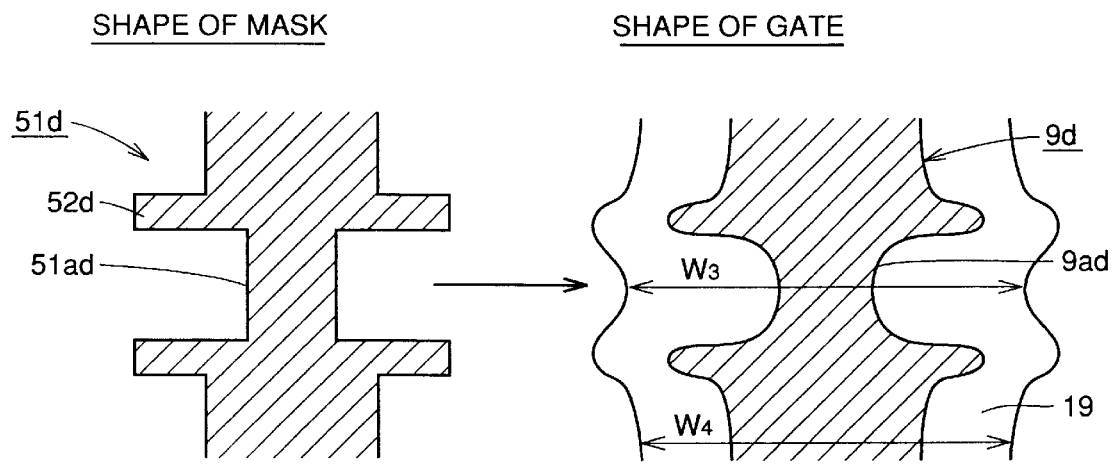

The length of a wide portion 52d may be extremely increased as shown in FIG. 29. It is only necessary that length W3 of sidewall insulating layer 19 covering narrowed portion 9ad of gate electrode layer 9d is formed to be smaller than length W4 of the main portion of gate electrode layer 9d.

This embodiment is not limited to the case in which the notch regions forming the narrowed portion are provided on both sides of the gate electrode layer, but is applicable to a case in which a notch region is provided on one side of the gate electrode layer.

In addition, this embodiment can be applied to either an nMOSFET or a pMOSFET.

Ninth Embodiment

This embodiment relates to a structure that achieves both of body fixing and reduction of the substrate bias effect without thinning a gate electrode layer and without thinning an SOI layer.

Figure 30:
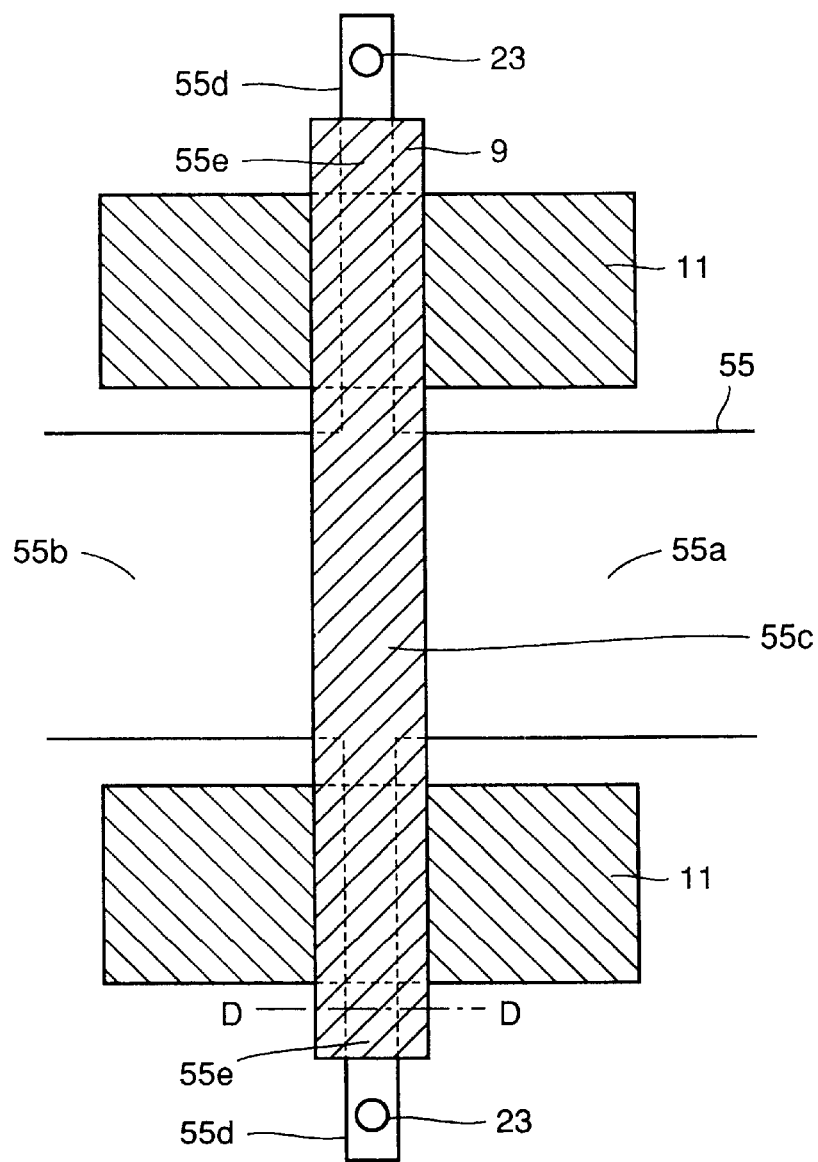
FIG. 30 is a plan view schematically showing a structure of a semiconductor device according to the ninth embodiment of the invention.

FIG. 30 is a plan view schematically showing a structure of a semiconductor device according to the ninth embodiment of the invention. Referring to FIG. 30, an SOI layer 55 is isolated like mesa (mesa isolation), or isolated by a field oxide film according to LOCOS (Local Oxidation of Silicon) to be formed into a prescribed shape.

Specifically, SOI layer 55 has an almost fixed width at a region where a drain region 55a and a source region 55b are formed, and includes an extended portion 55d electrically connected to a channel formation region 55c between drain region 55a and source region 55b and extending to the outside of a region where a transistor is formed. A body contact 23 is formed at a leading end of extended portion 55d. To a region of extended portion 55d, sandwiched between channel formation region 55c and a region to which body contact 23 is connected, an FS plate 11 is opposite via an insulating layer (not shown).

A gate electrode layer 9 which is opposite to channel formation region 55c with a gate insulating layer therebetween extends over FS plate 11 and is opposite to a region 55e of extended portion 55d, sandwiched between the region to which body contact 23 is connected and the region opposite to FS plate 11, via an insulating layer. Region 55e has an impurity concentration lower than that of another region of extended portion 55d and that of channel formation region 55c.

Therefore, if substrate bias is applied to extended portion 55d via body contact 23, region 55e is completely depleted preceding depletion of channel formation region 55c. As a result, application of the substrate bias from body contact 23 to channel formation region 55c is blocked when region 55e is completely depleted. Accordingly, body fixing is possible and an SOI-MOSFET which is not affected by the substrate bias effect is obtained.

Further, according to this embodiment, a thin portion (narrowed portion) is not necessary at a part of channel formation region 55c. Therefore, the device is not easily affected by punch-through.

In this structure, capacitance between gate electrode layer 9 and FS plate 11 could be increased since gate electrode layer 9 extends over FS plate 11. If it causes a serial problem, the capacitance can be reduced by removing FS plate 11 and using a structure of oxide film isolation formed of only oxide films over and under FS plate 11 and a sidewall.

Tenth Embodiment

This embodiment relates to a modification of the ninth embodiment.

Figure 31:
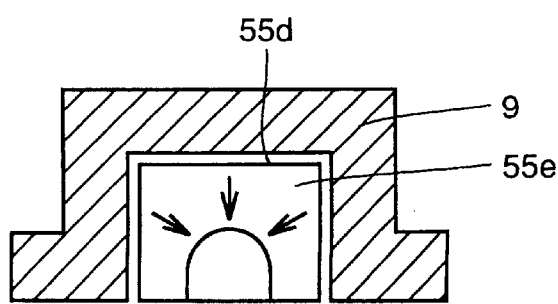
FIG. 31 is a schematic cross section corresponding to the cross section along the D—D line of FIG. 30 showing mesa isolation of a semiconductor layer of a semiconductor device according to the tenth embodiment of the invention.
Figure 32:
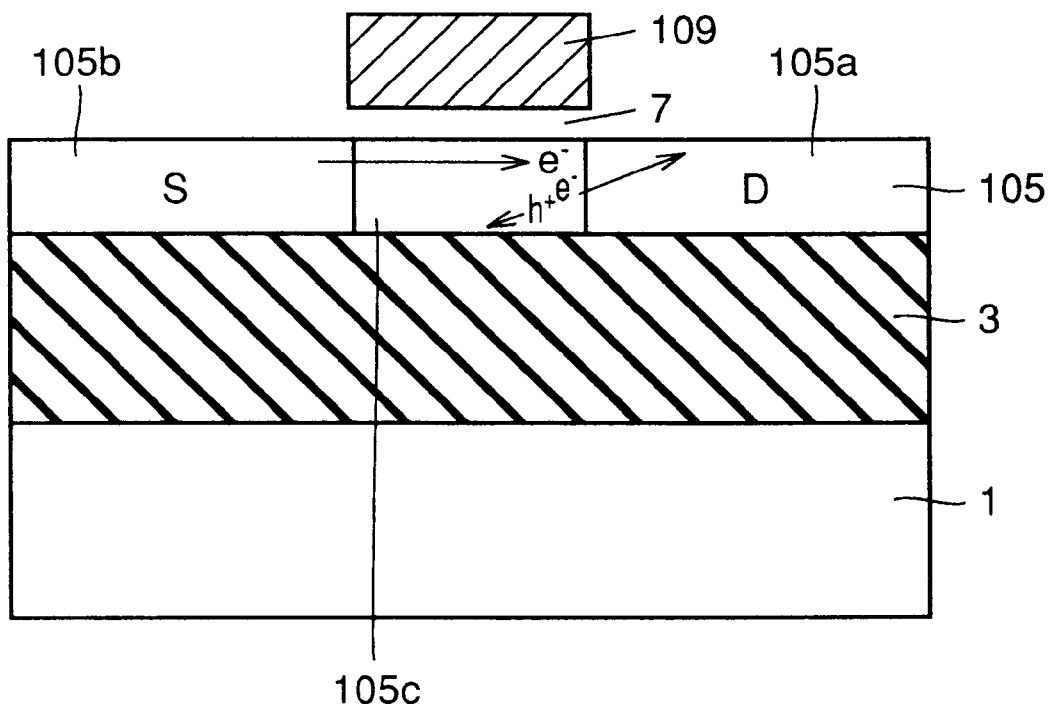
FIG. 32 is a cross sectional view schematically showing a structure of a conventional SOI-MOSFET.

FIG. 31 is a schematic cross section along the D—D line of FIG. 30. Referring to FIG. 31, this embodiment relates to mesa isolation of SOI layer 55 of the ninth embodiment. When the mesa isolation is used, gate electrode layer 9 can cover not only the top surface of region 55e but both side surfaces thereof. A depletion layer can be extended from the three surfaces (top surface and both side surfaces) to region 55e by gate electrode layer 9, so that complete depletion can be achieved more speedily and the influence of the substrate bias effect can be reduced further when substrate bias is applied.

The semiconductor device of the present invention has a structure which allows a region on the body contact side to be completely depleted prior to depletion of a central portion. Specifically, the cross sectional area of the edge portion of the channel formation region is made smaller than that of the central portion, or the impurity concentration of a region closer to the body contact than the central portion is made lower than that of the central portion.

The cross sectional area of the channel formation region refers to a cross section in the direction of the channel length of the channel formation region, the section sandwiched between the front surface and the back surface of the SOI layer.

The embodiments disclosed above should be considered as illustration at all points and should not be considered as limitation. The scope of the present invention is shown not by the description above but by the scope of claims for patent, and intended to include all modifications within meaning and scope equivalent to the scope of claims for patent.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, having a structure with a semiconductor layer formed on a substrate with an insulating layer interposed therebetween, comprising the steps of:
   forming an isolation conductive layer which is electrically insulated from said semiconductor layer;
   forming a gate electrode layer which is opposite to said semiconductor layer with a gate insulating layer therebetween; and
   forming a pair of source/drain regions spaced from each other by introducing impurities into said semiconductor layer using said gate electrode layer as a mask, wherein
   a gate insulation type field effect transistor is formed that is constituted of said pair of source/drain regions and said gate electrode layer and forming a channel in a channel formation region sandwiched between the paired said source/drain regions by controlling potential of said gate electrode layer,
   said gate insulation type field effect transistor can be electrically isolated from other elements by controlling potential of said isolation conductive layer to fix potential of a region of said semiconductor layer opposite to said isolation conductive layer,
   said channel formation region is formed to allow potential to be applied to said channel formation region from a prescribed region via the region of said semiconductor layer opposite to said isolation conductive layer,
   in said channel formation region, edge portions on both sides and a central portion between the edge portions are placed in a direction of a channel width, and
   said gate electrode layer is formed to have a region having a small gate length where the gate length is smaller on said edge portions than on said central portion.

2. The method of manufacturing a semiconductor device according to claim 1, wherein
   the step of forming said gate electrode layer includes a step of exposing a photoresist applied onto a conductive layer which is to be said gate electrode layer with exposure light transmitted through a photomask having a gate electrode pattern, forming a resist pattern by development and thereafter etching said conductive layer using said resist pattern as a mask, and
   a gap which separates said gate electrode pattern and has a width smaller than resolution limit of a conventional stepper is located at a position of said gate electrode pattern corresponding to one of said edge portions.

3. The method of manufacturing a semiconductor device according to claim 1, wherein
   the step of forming said gate electrode layer includes a step of patterning said conductive layer by photolithography with a reflection film formed on the conductive layer which is to be said gate electrode layer.

4. The method of manufacturing a semiconductor device according to claim 1, further comprising a step of forming an insulating layer which covers said gate electrode layer and thereafter anisotropically etching said insulating layer to leave said insulating layer at a sidewall of said gate electrode layer,
   the region having a small gate length of said gate electrode layer located on said edge portion is provided with a prescribed width in a direction of a gate width, and
   a film thickness of said insulating layer when it is formed is at least two times larger than said prescribed width.

5. The method of manufacturing a semiconductor device according to claim 1, wherein
   the step of forming said gate electrode layer includes a step of exposing a photoresist applied onto the conductive layer which is to be said gate electrode layer with exposure light transmitted through a photomask having a gate electrode pattern, forming a resist pattern by development, and thereafter etching said conductive layer using said resist pattern as a mask,
   a first line width at a position of said gate electrode pattern corresponding to said edge portion is smaller than a second line width at a position of said gate electrode pattern corresponding to said central portion, and
   a line width at a position corresponding to a portion between an edge portion and a central portion of said gate electrode pattern is larger than said second line width.

6. A method of manufacturing a semiconductor device having an SOI structure including elements formed in a semiconductor layer placed on a substrate with an insulating layer therebetween, comprising the steps of:
   forming an isolation structure on a main surface of said semiconductor layer;
   forming a gate electrode layer on the main surface of said semiconductor layer with a gate insulating layer interposed therebetween; and
   forming a pair of source/drain regions spaced from each other by implanting impurities into said semiconductor layer with said gate electrode layer used as a mask, and providing a channel formation region having a channel sandwiched between said paired source/drain regions, said channel being formed in said channel formation region by controlling potential of said gate electrode layer, a gate insulation type field effect transistor being electrically isolated from other elements by said isolation structure formed on the main surface of said semiconductor layer, said channel formation region being connected to said semiconductor layer having said isolation structure formed thereon, and potential being applicable to said channel formation region from a prescribed region via the region of said semiconductor layer having said isolation structure formed thereon, and said gate electrode layer having a smaller-area region above said channel formation region in the vicinity of said isolation structure and having a remaining portion, said smaller-area region being smaller than the remaining portion with respect to the area of cross section in the direction of a channel length.

7. The method of manufacturing a semiconductor device according to claim 6, wherein said smaller-area region has a channel length smaller than that of said remaining portion.

8. The method of manufacturing a semiconductor device according to claim 7, wherein said smaller-area region is formed only in the vicinity of said isolation structure in the vicinity of said prescribed region from which potential is applicable to said channel formation region.

9. The method of manufacturing a semiconductor device according to claim 8, wherein said channel formation region has edge portions on both sides and a central portion sandwiched between the edge portions placed in the direction of a channel width, and said edge portions have a region where the thickness of said semiconductor layer is smaller than the thickness of said semiconductor layer at said central portion.

10. The method of manufacturing a semiconductor device according to claim 6, wherein said step of forming said pair of source/drain regions includes a first step of forming a first impurity region of a relatively high concentration at said semiconductor layer by using said gate electrode layer as a mask and a second step of forming, after said first step and after forming a sidewall insulating layer on a sidewall of said gate electrode layer, a second impurity region of a relatively low concentration at said semiconductor layer adjacent to said first impurity region and on a side of said channel formation region, said second impurity region being formed by using said sidewall insulating layer and said gate electrode layer as a mask, and said second impurity region has a greater width in the direction of said channel length in a region adjacent to said channel formation region in the vicinity of said isolation structure than a width in the direction of said channel length in a region adjacent to said channel formation region distant from said isolation structure.

11. The method of manufacturing a semiconductor device according to claim 6, wherein said step of forming said pair of source/drain regions includes a first step of forming a first impurity region by implanting impurities into said semiconductor layer by using said gate electrode as a mask, and a second step of forming a second impurity region, after forming a mask in said smaller-area region, by implanting into said semiconductor layer, impurities of the same conductivity type as that of said impurities used for forming said first impurity region.

* * * * *